US010529426B2

(12) United States Patent
Lin et al.

(10) Patent No.: US 10,529,426 B2
(45) Date of Patent: Jan. 7, 2020

(54) DATA WRITING METHOD, VALID DATA IDENTIFYING METHOD AND MEMORY STORAGE APPARATUS

(71) Applicant: PHISON ELECTRONICS CORP., Miaoli (TW)

(72) Inventors: Sung-Yao Lin, New Taipei (TW); Yueh-Pu Kuo, New Taipei (TW); Yu-Min Hsiao, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 148 days.

(21) Appl. No.: 15/910,030

(22) Filed: Mar. 2, 2018

(65) Prior Publication Data
US 2019/0198115 A1 Jun. 27, 2019

(30) Foreign Application Priority Data

Dec. 27, 2017 (TW) .............................. 106146014 A

(51) Int. Cl.
| | |
|---|---|
| *G06F 12/00* | (2006.01) |
| *G11C 16/10* | (2006.01) |
| *G06F 3/06* | (2006.01) |
| *G11C 11/56* | (2006.01) |
| *G06F 11/10* | (2006.01) |
| *G11C 29/52* | (2006.01) |
| *H03M 13/11* | (2006.01) |

(52) U.S. Cl.
CPC ............ *G11C 16/10* (2013.01); *G06F 3/0604* (2013.01); *G06F 3/0659* (2013.01); *G06F 3/0679* (2013.01); *G06F 11/1068* (2013.01); *G11C 11/56* (2013.01); *G11C 29/52* (2013.01); *H03M 13/1102* (2013.01)

(58) Field of Classification Search
None
See application file for complete search history.

(56) References Cited

U.S. PATENT DOCUMENTS 7,793,061 B1 * 9/2010 Gupta ................. G06F 11/1441
711/108
8,473,672 B2 * 6/2013 Moshayedi ......... G06F 12/0246
711/103

(Continued)

FOREIGN PATENT DOCUMENTS

TW          201423399          6/2014

*Primary Examiner* — John A Lane
(74) *Attorney, Agent, or Firm* — JCIPRNET

(57) ABSTRACT

A data writing method, a valid data identifying method and a memory storage apparatus using the same are provided. The method includes receiving first data; using a first programming mode to write first sub-data of the first data into a first physical programmed unit of at least a first memory sub-module of a plurality of memory sub-modules, wherein a size of each of the first sub-data is the same as a preset size; and using a second programming mode to write remaining sub-data of the first data into a second physical programmed unit of a second memory sub-module of the plurality of memory submodules, wherein the size of the remaining sub-data is less than the preset size, and the second memory sub-module is different from a third memory sub-module of the first memory submodules which is a last memory sub-module for writing the first sub-data.

20 Claims, 11 Drawing Sheets

(56) References Cited

U.S. PATENT DOCUMENTS

| | | | |
|---|---|---|---|
| 8,850,134 B1* | 9/2014 | Murdock | G06F 12/04 |
| | | | 710/35 |
| 9,727,461 B2* | 8/2017 | Nakao | G06F 12/0246 |
| 10,073,644 B2* | 9/2018 | Wada | G06F 3/0664 |
| 10,083,117 B2* | 9/2018 | Feng | G06F 12/0246 |

* cited by examiner

DATA WRITING METHOD, VALID DATA IDENTIFYING METHOD AND MEMORY STORAGE APPARATUS

CROSS-REFERENCE TO RELATED APPLICATION

This application claims the priority benefit of Taiwan application serial no. 106146014, filed on Dec. 27, 2017. The entirety of the above-mentioned patent application is hereby incorporated by reference herein and made a part of this specification.

BACKGROUND

Technology Field

The invention relates to a data writing method, a valid data identifying method and a memory storage apparatus.

Description of Related Art

Digital cameras, cell phones, and MP3 players have been rapidly developed in recently years, and thus, the consumers' demands to storage media has increased drastically. Because a rewritable non-volatile memory module (for example, a flash memory) is provided with features such as data non-volatility, low power consumption, small volume, and non-mechanical structure, the rewritable non-volatile memory module is adaptable for being built in the multimedia apparatuses as numerated above.

According to the number of bits capable of being stored by each memory cell, NAND flash memory modules can be classified into a single level cell (SLC) NAND flash memory module, a muiti level cell (MLC) NAND flash memory module and a trinary level cell (TLC) NAND flash memory module, wherein each memory cell of the SLC NAND flash memory module is capable of storing 1 bit of data (i.e., "1" and "0"), each memory cell of the MLC NAND flash memory module is capable of storing 2 bits of data, and each memory cell of the TLC NAND flash memory module is capable of storing 3 bits of data. Additionally, the memory cells of the MLC NAND flash memory module and the TLC NAND flash memory module may also be employed to simulate the SLC NAND flash memory module, while the memory cells in the MLC NAND flash memory module and the TLC NAND flash memory module which are employed for simulating the SLC NAND flash memory module store only 1 bit of data.

Generally, if a memory cell is capable of storing multiple bits (for example, the MLC or the TLC NAND flash memory module), physical programming units belonging to the same word line are at least classified into a lower physical programming unit and an upper physical programming unit. For example, in the MLC NAND flash memory module, a least significant bit (LSB) of one memory cell belongs to the lower physical programming unit, and a most significant bit (MSB) of the memory cell belongs to the upper physical programming unit. In an exemplary embodiment, the lower physical programming unit is also referred to as a fast page, and the upper physical programming unit is also referred to as a slow page. Particularly, in the MLC NAND flash memory module, one lower physical programming unit and one upper physical programming unit corresponding to the lower physical programming unit may be collectively referred to as a "physical programming unit set". Additionally, in the TLC NAND flash memory module, a LSB of one memory cell belongs to the lower physical programming unit, a center significant bit (CSB) of the memory cell belongs to a center physical programming unit, and a MSB of the memory cell belongs to the upper physical programming unit. Particularly, in the TLC NAND flash memory module, one lower physical programming unit together with one center physical programming unit and one upper physical programming unit corresponding to the lower physical programming unit may be collectively referred to as a "physical programming unit set".

Generally, a rewritable non-volatile memory module may include a plurality of memory sub-modules, and each of the memory sub-modules may be coupled to a memory controller respectively through separate data buses (or the same data bus). Accordingly, a memory controller may write data into each of the memory sub-modules through the data bus in a parallel manner or an interleave mode.

Particularly, each of the memory sub-modules may include a first area and a second area. The physical programming units of each first area are written in a first programming mode (which is also referred to as a multi-page programming mode), and a physical programming unit set is used as a unit for the writing operation in the first programming mode. In other words, each of the memory cells constituting the physical programming units of each first area is capable of storing multiple bits of data. If it is assumed that a rewritable non-volatile memory module is a MLC NAND flash memory module, each memory cell in the first area is capable of storing 2 bits of data. Additionally, when the first area is being written, one data is written into a physical programming unit set at one time. If there is any one data which does not meet a size of each physical programming unit set, the data is written into the second areas rather than the first areas in consideration of a storage stability issue of the rewritable non-volatile memory module.

Additionally, the physical programming units of each second area are written in a second programming mode (which is also referred to as a single-page programming mode), and a physical programming unit is used as a unit for the writing operation in the second programming mode. In other words, each of the memory cells constituting the physical programming units of each second area is capable of storing only 1 bit of data. For example, each of the memory cells constituting the physical programming units in the second area store data merely by using the LSB. Namely, if the MLC NAND flash memory module (or the TLC NAND flash memory module) is employed to simulate the SLC NAND flash memory module, only the lower physical programming unit of the MLC NAND flash memory module (or the TLC NAND flash memory module) may be employed for writing (or storing) data.

When one data is written into the rewritable non-volatile memory module, the memory controller divides the data into a plurality of sub-data according to the size of each physical programming unit set and sequentially writes the sub-data matching the size of each physical programming unit set into the first area of each memory sub-module. For instance, if it is assumed that the rewritable non-volatile memory module has 4 memory sub-modules, and the data may be divided into 5 sub-data matching the size of each "physical programming unit set" and one remaining sub-data matching a size of only one "physical programming unit". In this circumstance, the memory controller writes the 5 sub-data matching the size of each "physical programming unit set" into the first areas of the aforementioned 4 memory sub-modules by using the interleave mode. For example, the first sub-data matching the size of each "physical programming unit set" is written into the first area of the first memory sub-module, the second sub-data matching the size of each "physical programming unit set" is written into the first area of the second memory sub-module and so on. Additionally, after the former 4 sub-data matching the size of each "physical programming unit set" are written into the first areas of the 4 memory sub-modules, the memory controller writes the fifth sub-data matching the size of each "physical programming unit set" into the first area of the first memory sub-module.

It should be noted that in consideration of the storage stability issue of the rewritable non-volatile memory module, the remaining sub-data matching the size of only one "physical programming unit" is incapable of being written into the first areas of the aforementioned memory sub-modules. Thus, this remaining sub-data is written into the second area of a certain memory sub-module in a "second programming mode".

Generally, the first area and the second area are independent from each other in operation without any sequence relationship therebetween. For instance, when writing the first areas, the memory controller sequentially writes the first area of the first memory sub-module, the first area of the second memory sub-module and so on. Similarly, when writing the second areas, the memory controller sequentially writes the second area of the first memory sub-module, the second area of the second memory sub-module and so on. However, taking the above example for example, after the last sub-data matching the size of each "physical programming unit set" is written into the first memory sub-module, and if it is assumed that a memory sub-module employed for writing the remaining sub-data matching the size of the "physical programming unit" is also exactly the first memory sub-module, the memory controller has to wait for the completion of the writing of the sub-data matching the size of each "physical programming unit set" and then performs the writing of the remaining sub-data. Namely, when performing the writing on the first area and the second area of the same memory sub-module, the memory controller has to wait for the rewritable non-volatile memory module writing the data into the first area and then, is allowed to issue an instruction sequence to write data into the second area. Nevertheless, this manner cannot achieve writing the first area and the second area simultaneously or in parallel, which results in the reduction of writing efficiency.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data writing method, a valid data identifying method and a memory storage apparatus which can achieve reducing a time for writing (or programming) and improving efficiency of writing data. Additionally, the valid data identifying method of the invention can effectively identify valid data stored in a rewritable non-volatile memory module after the memory storage apparatus is re-powered on.

A data writing method for a rewritable non-volatile memory module is provided by the invention. The rewritable non-volatile memory module includes a plurality of memory sub-modules coupled to a memory control circuit unit, and each of the memory sub-modules includes a plurality of physical programming units. The data writing method includes: receiving first data; using a first programming mode to write first sub-data of the first data into a first physical programming unit of at least one first memory sub-module among the memory sub-modules, wherein a size of each of the first sub-data is the same as a preset size; and using a second programming mode to write remaining sub-data other than the first sub-data of the first data into a second physical programming unit of a second memory sub-module among the memory sub-modules, wherein a size of the remaining sub-data is less than the preset size, wherein the number of bits stored by each of the physical programming units programmed by using the first programming mode is greater than the number of bits stored by each of the physical programming units programmed by using the second programming mode, and the second memory sub-module is different from a third memory sub-module of the at least one first memory sub-module which is a last memory sub-module for writing the first sub-data.

A memory storage apparatus provided by the invention includes a connection interface unit configured to be coupled to a host system, a rewritable non-volatile memory module including a plurality of memory sub-modules, wherein each of the memory sub-modules includes a plurality of physical programming units, and a memory control circuit unit coupled to the connection interface unit and the memory sub-modules of the rewritable non-volatile memory module. The memory control circuit unit is configured to receive first data. The memory control circuit unit is further configured to use a first programming mode to write first sub-data of the first data into a first physical programming unit of at least one first memory sub-module among the memory sub-modules, wherein a size of each of the first sub-data is the same as a preset size. The memory control circuit unit is further configured to use a second programming mode to write remaining sub-data other than the first sub-data of the first data into a second physical programming unit of a second memory sub-module among the memory sub-modules, wherein a size of the remaining sub-data is less than the preset size. The number of bits stored by each of the physical programming units programmed by using the first programming mode is greater than the number of bits stored by each of the physical programming units programmed by using the second programming mode. The second memory sub-module is different from a third memory sub-module of the at least one first memory sub-module which is a last memory sub-module for writing the first sub-data.

A valid data identifying method for a rewritable non-volatile memory module is provided by the invention. The rewritable non-volatile memory module includes a plurality of memory sub-modules coupled to a memory control circuit unit, each of the memory sub-modules includes a first area and a second area, and each of the first areas and each of the second areas respectively include a plurality of physical programming units. The valid data identifying method includes: when the rewritable non-volatile memory module is powered on, searching among at least one first data number in the first areas of the memory sub-modules to obtain a third data number, wherein the third data number is greater than the other data numbers among the at least one first data number; searching among at least one second data number in the second areas of the memory sub-modules to obtain a fourth data number, wherein the fourth data number is greater than the other data numbers among the at least one second data number; and determining whether valid data is stored in the second areas according to the third data number and the fourth data number.

A memory storage apparatus provided by the invention includes a connection interface unit configured to be coupled to a host system and a rewritable non-volatile memory module including a plurality of memory sub-modules, wherein each of the memory sub-modules includes a first area and a second area, and each of the first areas and each of the second areas respectively include a plurality of physical programming units, and a memory control circuit unit coupled to the connection interface unit and the memory sub-modules of the rewritable non-volatile memory module. When the rewritable non-volatile memory module is powered on, the memory control circuit unit is configured to search among at least one first data number in the first areas of the memory sub-modules to obtain a third data number, wherein the third data number is greater than the other data numbers among the at least one first data number. The memory control circuit unit is further configured to search among at least one second data number in the second areas of the memory sub-modules to obtain a fourth data number, wherein the fourth data number is greater than the other data numbers among the at least one second data number. The memory control circuit unit is further configured to determine whether valid data is stored in the second areas according to the third data number and the fourth data number.

Based on the above, the data writing method, the valid data identifying method and the memory storage apparatus of the invention can achieve reducing the time for writing (or programming) data and improving the efficiency of writing data. Moreover, the valid data identifying method of the invention can achieve effectively identifying the valid data stored in the rewritable non-volatile memory module after the memory storage apparatus is re-powered on.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
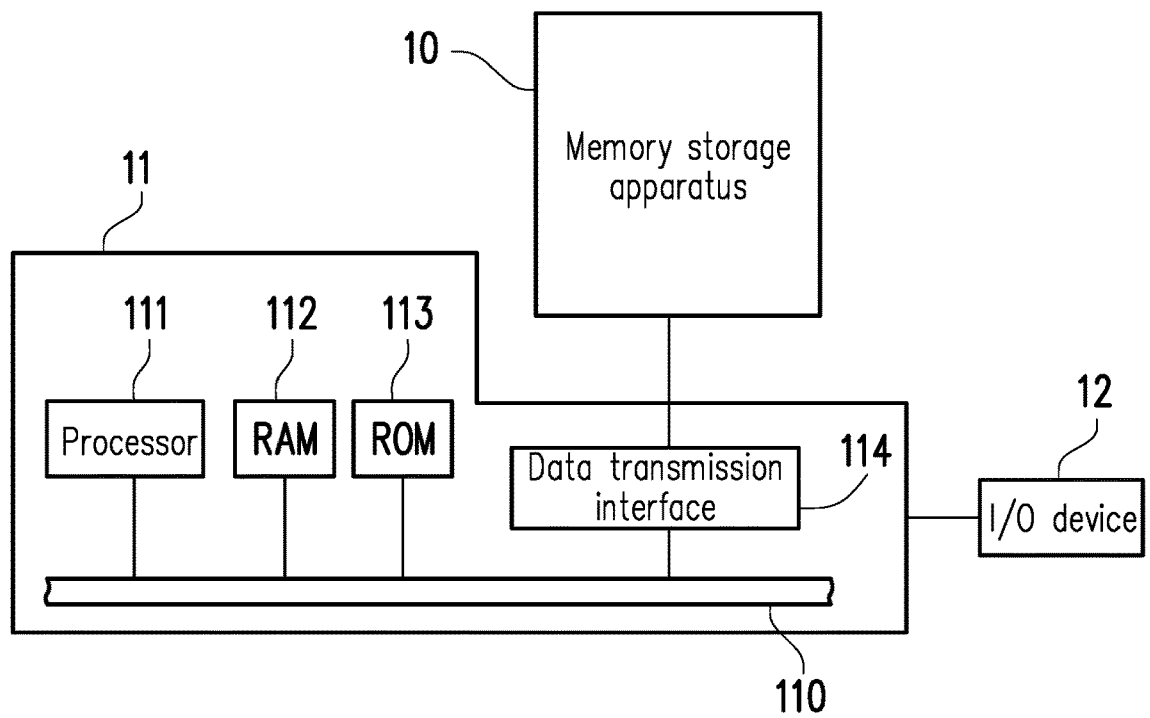
FIG. 1 is a schematic diagram illustrating a host system, a memory storage apparatus and an input/output (I/O) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (which is also referred to as a memory storage system) includes a rewritable non-volatile memory module and a controller (which is also referred to as a control circuit unit). The memory storage apparatus is usually used together with a host system, such that the host system can write data into the memory storage apparatus or read data from the memory storage apparatus.

Figure 2:
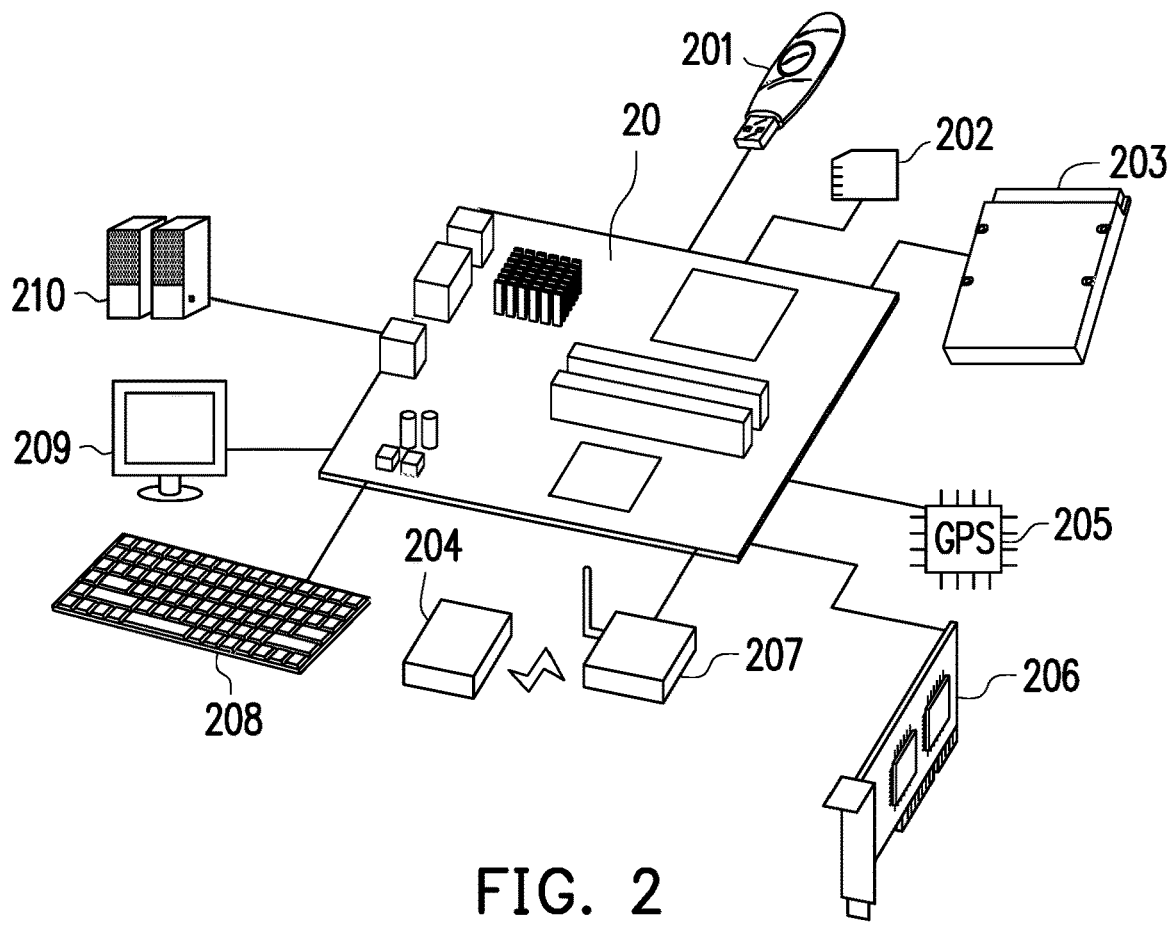
FIG. 2 is a schematic diagram illustrating a host system, a memory storage apparatus and an I/O device according to another exemplary embodiment of the invention.

FIG. 1 is a schematic diagram illustrating a host system, a memory storage apparatus and an input/output (I/O) device according to an exemplary embodiment of the invention, and FIG. 2 is a schematic diagram illustrating a host system, a memory storage apparatus and an I/O device according to another exemplary embodiment of the invention.

Referring to FIG. 1 and FIG. 2, a host system 11 generally includes a processor 111, a random access memory (RAM)

112, a read only memory (ROM) 113 and a data transmission interface 114. The processor 111, the RAM 112, the ROM 113 and the data transmission interface 114 are coupled to a system bus 110.

In the present exemplary embodiment, the host system 11 is coupled to the memory storage apparatus 10 through the data transmission interface 114. For example, the host system 11 may write data into the memory storage apparatus 10 or read data from the memory storage apparatus 10 through the data transmission interface 114. Additionally, the host system 11 is coupled to the I/O device 12 through the system bus 110. For example, the host system 11 may transmit output signals to the I/O device 12 or receive input signals from the I/O device 12 through the system bus 110.

In the present exemplary embodiment, the processor 111, the RAM 112, the ROM 113 and the data transmission interface 114 may be disposed on a mainboard 20 of the host system 11. The number of the data transmission interface 114 may be one or plural. Through the data transmission interface 114, the mainboard 20 may be coupled to the memory storage apparatus 10 in a wired or a wireless manner. The memory storage apparatus 10 may be, for example, a flash drive 201, a memory card 202, a solid state drive (SSD) 203 or a wireless memory storage apparatus 204. The wireless memory storage apparatus 204 may be a memory storage apparatus based on various wireless communication technologies, for example, a near field communication (NFC) memory storage apparatus, a wireless fidelity (WiFi) memory storage apparatus, a Bluetooth memory storage apparatus or a Bluetooth low energy (BLE) memory storage apparatus (e.g., iBeacon). Additionally, the mainboard 20 may also be coupled to various I/O devices including a global positioning system (GPS) module 205, a network interface card 206, a wireless transmission device 207, a keyboard 208, a monitor 209 and a speaker 210 through the system bus 110. For example, in an exemplary embodiment, the mainboard 20 may access the wireless memory storage apparatus 204 through the wireless transmission device 207.

Figure 3:
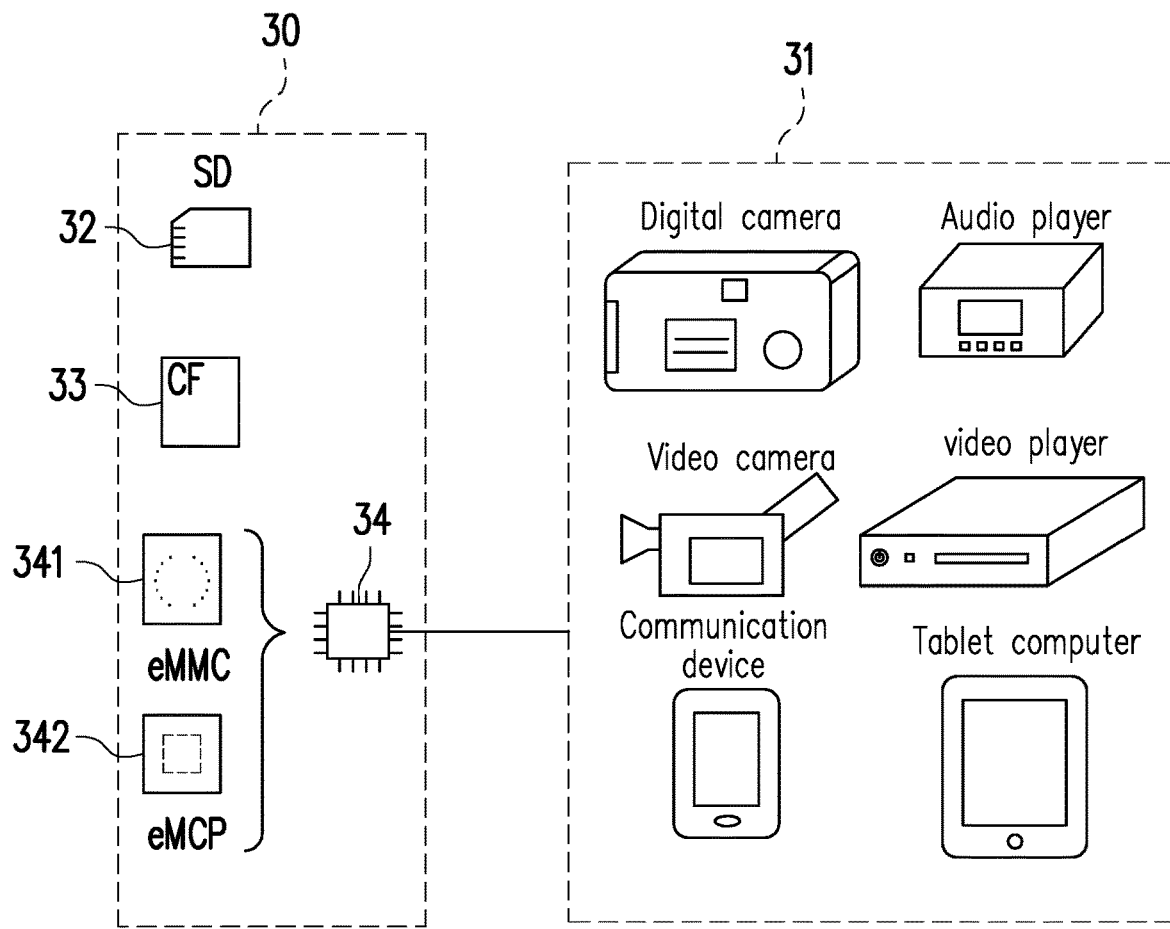
FIG. 3 is a schematic diagram illustrating a host system and a memory storage apparatus according to another exemplary embodiment of the invention.

In an exemplary embodiment, the aforementioned host system may be any system capable of substantially cooperating with the memory storage apparatus for storing data. Although the host system is illustrated as a computer system for description in the foregoing exemplary embodiment, however, FIG. 3 is a schematic diagram illustrating a host system and a memory storage apparatus according to another exemplary embodiment of the invention. Referring to FIG. 3, in another exemplary embodiment, the host system 31 may also be a system, for example, a digital camera, a video camera, a communication device, an audio player, a video player or a tablet computer, while the memory storage apparatus 30 may be various non-volatile memory storage apparatuses used by the host system 31, for example, a secure digital (SD) card 32, a compact flash (CF) card 33 or an embedded storage apparatus 34. The embedded storage apparatus 34 includes various embedded storage apparatuses capable of directly coupling a memory module onto a substrate of the host system 31, for example, an embedded multi media card (eMMC) 341 and/or an embedded multi chip package (eMCP) storage apparatus 342.

Figure 4:
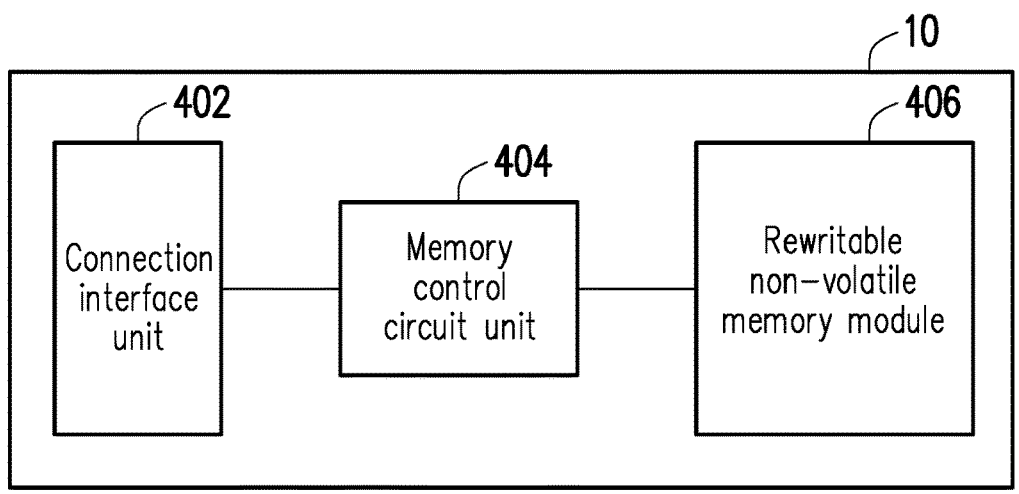
FIG. 4 is a schematic block diagram illustrating a host system and a memory storage apparatus according to an exemplary embodiment of the invention.

FIG. 4 is a schematic block diagram illustrating a host system and a memory storage apparatus according to an exemplary embodiment of the invention.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a secure digital (SD) interface standard. However, it should be understood that the invention is not limited thereto, the connection interface unit 402 may also be compliable with a serial advanced technology attachment (SATA) standard, a parallel advanced technology attachment (PATA) standard, an institute of electrical and electronic engineers (IEEE) 1394 standard, a peripheral component interconnect express (PCI Express) standard, a universal serial bus (USB) standard, an ultra high speed-I (UHS-I) interface standard, an ultra high speed-ii (UHS-II) interface standard, a memory stick (MS) interface standard, a multi-chip package (MCP) interface standard, a multi media card (MMC) interface standard, an embedded multimedia card (eMMC) interface standard, a universal flash storage (UFS) interface standard, an embedded multi chip package (eMCP) interface standard, a compact flash (CF) interface standard, an integrated device electronics (IDE) standard or other suitable standards. In the present exemplary embodiment, the connection interface unit 402 and the memory control circuit unit 404 may be packaged in one chip, or the connection interface unit 402 may be laid outside a chip containing the memory control circuit module.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and is configured to store data written by the host system 11. The rewritable non-volatile memory module 406 may be a single level cell (SLC) NAND flash memory module (i.e., a flash memory module capable of storing 1 bit in one memory cell), a multi level cell (MLC) NAND flash memory module (i.e., a flash memory module capable of storing 2 bits in one memory cell), a triple level cell (TLC) NAND flash memory module (i.e., a flash memory module capable of storing 3 bits in one memory cell), other flash memory modules or other memory modules having the same features.

Figure 5:
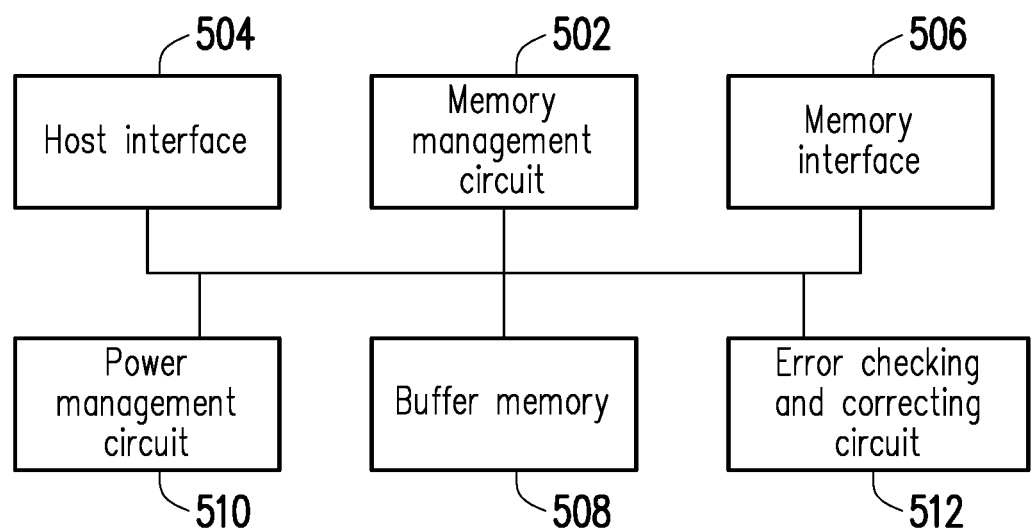
FIG. 5 is a schematic block diagram illustrating a memory control circuit module according to an exemplary embodiment of the invention.

FIG. 5 is a schematic block diagram illustrating a memory control circuit module according to an exemplary embodiment of the invention.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands, and during operations of the memory storage apparatus 10, the control commands are executed to perform various operations such as data writing, data reading and data erasing.

In the present exemplary embodiment, the control commands of the memory management circuit 502 are implemented in a firmware form. For example, the memory management circuit 502 has a microprocessor unit (not illustrated) and a ROM (not illustrated), and the control commands are burned into the ROM. When the memory storage apparatus 10 operates, the control commands are executed by the microprocessor unit to perform operations of writing, reading or erasing data.

In another exemplary embodiment of the invention, the control commands of the memory management circuit 502 may also be stored as program codes in a specific area (for example, a system area in a memory module exclusively used for storing system data) of the rewritable non-volatile memory module 406. Additionally, the memory management circuit 502 has a microprocessor unit (not illustrated), a ROM (not illustrated) and a RAM (not illustrated). More particularly, the ROM has a boot code, and when the memory control circuit unit 404 is enabled, the microprocessor unit first executes the boot code to load the control commands stored in the rewritable non-volatile memory module 406 to the RAM of the memory management circuit 502. Thereafter, the microprocessor unit executes the control commands to perform the operation of writing, reading or erasing data.

Additionally, in another exemplary embodiment of the invention, the control commands of the memory management circuit 502 may also be implemented in a hardware form. For example, the memory management circuit 502 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage physical erasing units of the rewritable non-volatile memory module 406. The memory writing circuit is configured to issue a write command to the rewritable non-volatile memory module 406 to write data into the rewritable non-volatile memory module 406. The memory reading circuit is configured to issue a read command to the rewritable non-volatile memory module 406 to read data from the rewritable non-volatile memory module 406. The memory erasing circuit is configured to issue an erase command to the rewritable non-volatile memory module 406 to erase data from the rewritable non-volatile memory module 406. The data processing circuit is configured to process data which is to be written into the rewritable non-volatile memory module 406 and data which is read from the rewritable non-volatile memory module 406.

The host interface 504 is coupled to the memory management circuit 502 and is configured to be coupled to the connection interface unit 402 to receive and identify commands and data transmitted from the host system 11. Namely, the commands and the data transmitted from the host system 11 are transmitted to the memory management circuit 502 through the host interface 504. In the present exemplary embodiment, the host interface 504 is compliable with the SATA standard. However, it should be understood that the invention is not limited thereto, and the host interface 504 may also be compliable with the PATA standard, the IEEE 1394 standard, the PCI Express standard, the USB standard, the UHS-I standard, the UHS-II standard, the SD standard, the MS standard, the MMC standard, the CF standard, the IDE standard or other standards suitable for data transmission.

The memory interface 506 is coupled to the memory management circuit 502 and is configured to access the rewritable non-volatile memory module 406. Namely, data to be written into the rewritable non-volatile memory module 406 is converted into a form acceptable for the rewritable non-volatile memory module 406 through the memory interface 506.

In an exemplary embodiment, the memory control circuit unit 404 may also include a buffer memory 508, a power management circuit 510 and an error checking and correcting circuit 512.

The buffer memory 508 is coupled to the memory management circuit 502 and is configured to temporarily store data and commands from the host system 11 or data from the rewritable non-volatile memory module 406.

The power management circuit 510 is coupled to the memory management circuit 502 and is configured to control the power of the memory storage apparatus 10.

The error checking and correcting circuit 512 is coupled to the memory management circuit 502 and is configured to perform an error checking and correcting procedure to ensure data accuracy. Specifically, when the memory management circuit 502 receives a write command from the host system 11, the error checking and correcting circuit 512 generates an error checking and correcting code (ECC code) for data corresponding to the write command, and the memory management circuit 502 writes the data corresponding to the write command together with the corresponding ECC code into the rewritable non-volatile memory module 406. Afterwards, the memory management circuit 502 reads the ECC code corresponding to the data while reading the data from the rewritable non-volatile memory module 406, and the error checking and correcting circuit 512 performs the error checking and correcting procedure on the read data according to the ECC code.

In the present exemplary embodiment, the error checking and correcting circuit 512 is implemented by a low density parity code (LDPC). However, in another exemplary embodiment, the error checking and correcting circuit 512 may be implemented by another encoding/decoding algorithm, such as a BCH code, a convolutional code, a turbo code or a bit flipping algorithm.

To be specific, the memory management circuit 202 generates an error correcting code frame (ECC frame) according to received data and a corresponding ECC code (which is also referred to as an error correcting code (ECC)) and writes the ECC frame into the rewritable non-volatile memory module 406. Then, when the memory management circuit 502 reads data from the rewritable non-volatile memory module 406, the error checking and correcting circuit 512 verifies accuracy of the read data according to the ECC in the ECC frame.

Operations performed by the memory management circuit 502, the host interface 504, the memory interface 506, the buffer memory 508, the power management circuit 510 and the error checking and correcting circuit 512 may also be referred to as being performed by the memory control circuit unit 404.

It is noted that in the following description, some terms may be replaced with corresponding abbreviations for ease of reading (see Table 1).

TABLE 1

| rewritable non-volatile memory module | RNVM module |
|---|---|
| physical programming unit | PPU |
| physical erasing unit | PEU |
| memory sub-module | MSM |
| memory control circuit unit | MCCU |

Figure 6:
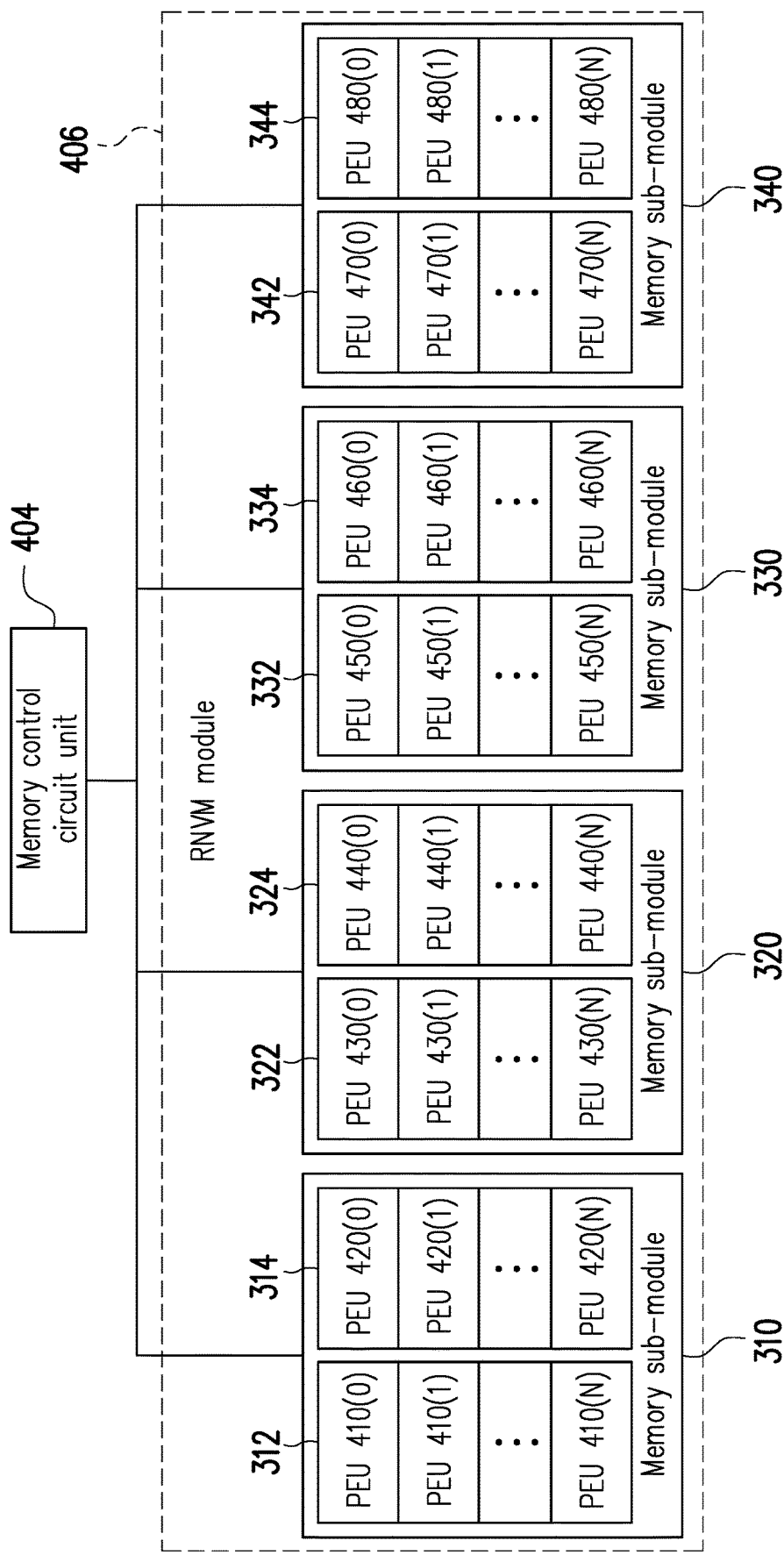
FIG. 6 is a schematic block diagram illustrating the rewritable non-volatile memory module according to an exemplary embodiment of the invention.

FIG. 6 is a schematic block diagram illustrating the RNVM module according to an exemplary embodiment of the invention.

Referring to FIG. 6, the RNVM module 406 includes a MSM 310, a MSM 320, a MSM 330 and a MSM 340 (which are referred to as MSMs 310 to 340). For example, each of the MSMs 310 to 340 is respectively a memory die. The MSM 310 has a first plane 312 (including PEUs 410(0) to 410(N) and a second plane 314 (including PEUs 420(0) to 420(N)), the MSM 320 has a first plane 322 (including PEUs 430(0) to 430(N)) and a second plane 324 (including PEUs 440(0) to 440(N)), the MSM 330 has a first plane 332 (including PEUs 450(0) to 450(N) and a second plane 334 (including PEUs 460(0) to 460(N)), and the MSM 340 has a first plane 342 (including PEUs 470(0) to 470(N)) and a second plane 344 (including PEUs 480(0) to 480(N)).

For example, the MSMs 310 to 340 may be coupled to the MCCU 404 through a data bus. In this case, the MCCU 404 may write data into the MSMs 310 to 340 through the single data bus in an interleave mode.

Specially, each of the MSMs 310 to 340 may include a plurality of word lines, and a plurality of memory cells on the same word line constitute a plurality of PPUs. Each PEU of each of the MSMs 310 to 340 has a plurality of PPUs, where the PPUs belonging to the same PEU may be independently written and erased at the same time. For example, each PEU is composed of 128 PPUs. However, it should be understood that the invention is not limited thereto, and each PEU may also be composed of 64 PPUs, 256 PPU or any number of PPUs.

To be more detailed, the PEU is the smallest unit for erasing. Namely, each PEU contains the least number of memory cells to be erased together. The PPU is the smallest unit for programming. Namely, the PPU is the smallest unit for writing data. It is to be noted that in another exemplary embodiment, one PEU may also refer to a physical address, a PPU or may be composed of a plurality of continuous or discontinuous physical addresses.

It is to be mentioned that the RNVM module 406 is illustrated as including 4 MSMs as an example in the present exemplary embodiment, but the invention is not limited thereto. In other embodiments, the RNVM module 406 may also include more or fewer MSMs.

Figure 7:
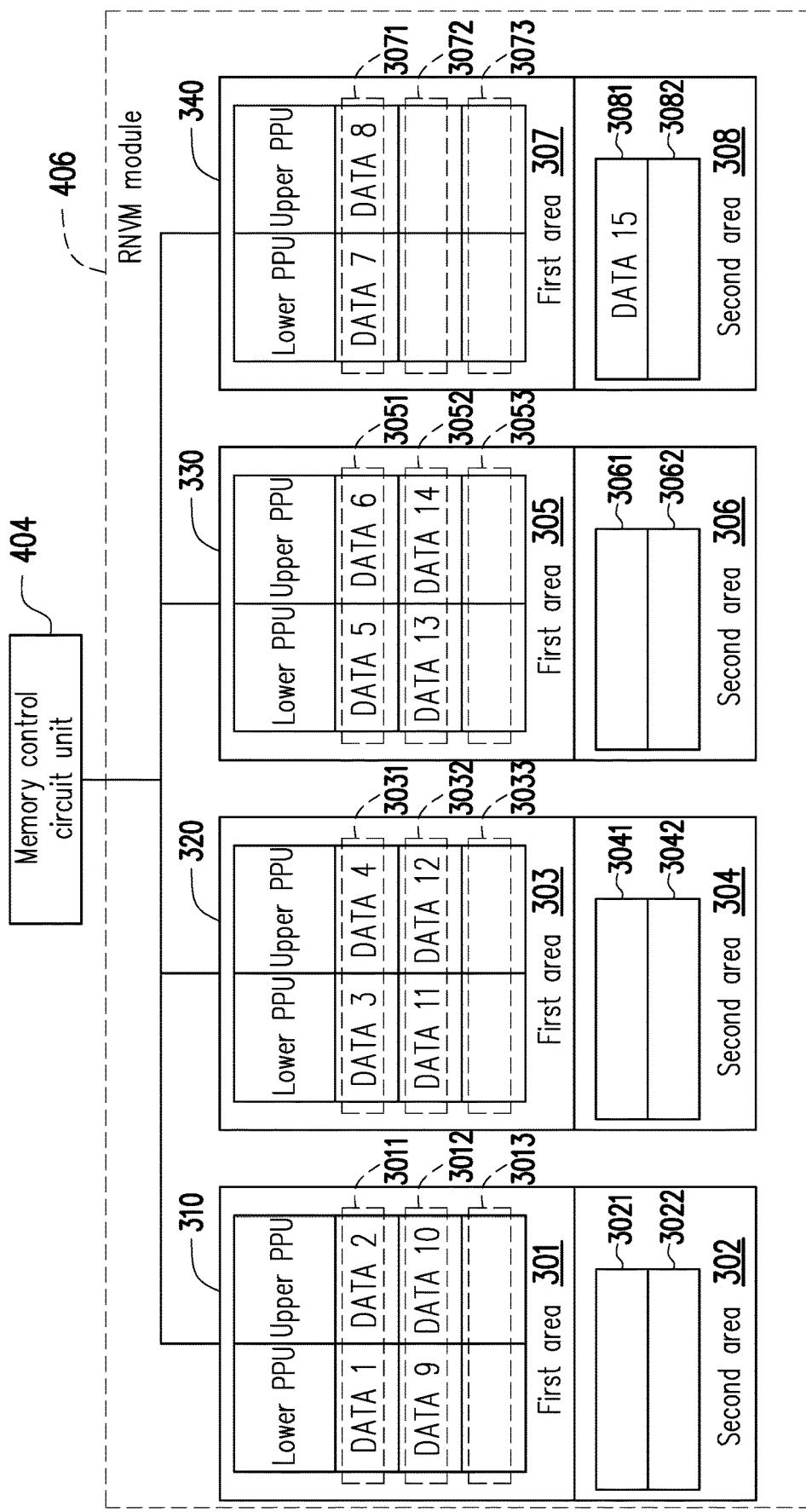
FIG. 7 is a schematic block diagram of an implementation example of the rewritable non-volatile memory module.

FIG. 7 is a schematic block diagram of an implementation example of the RNVM module.

In the present exemplary embodiment, the RNVM module 406 including the MSMs 310 to 340 arranged in an order is illustrated for example. The MSM 310 has a first area 301 and a second area 302, the MSM 320 has a first area 303 and a second area 304, the MSM 330 has a first area 305 and a second area 306, and the MSM 340 has a first area 307 and a second area 308. It is assumed that the RNVM module 406 is a MLC NAND flash memory module, each of the memory cells in the first area of each of the MSMs 310 to 340 is capable of storing 2 bits, the memory cells on the same word line constitute one or a plurality of PPUs, and the PPUs on the same word line may be at least classified into a lower PPU and an upper PPU. Specifically, the PPUs of each of the first area 301, the first area 303, the first area 305 and the first area 307 (which are referred to as the first areas 301 to 307) are written by using a first programming mode, and one "PPU set" is used as a unit for the writing operation in the first programming mode. The PPUs of each of the second area 302, the second area 304, the second area 306 and the second area 308 (which are referred to as the second areas 302 to 308) are written by using a second programming mode, and one "PPU" is used as a unit for the writing operation in the second programming mode.

In the present exemplary embodiment, a least significant bit (LSB) of each memory cell belonging to the same word line constitutes a lower PPU, a most significant bit (MSB) of each memory cell belonging to the same word line constitutes an upper PPU, and the lower PPU and the upper PPU belonging to the same word line constitute a PPU set. For example, the lower PPU and the upper PPU constituted by the memory cells on one word line of the MSM 310 may constitute a PPU set 3011. The lower PPU and the upper PPU constituted by the memory cells on another word line of the MSM 310 may constitute a PPU set 3012. The lower PPU and the upper PPU constituted by the memory cells on yet another word line of the MSM 310 may constitute a PPU set 3013. Therein, the PPU sets 3011 to 3013 belong to the first area 301 of the MSM 310.

Additionally, the second area 302 of the MSM 310 may include a PPU 3021 and a PPU 3022. The PPU 3021 and the PPU 3022 may be written by using the second programming mode, and one "PPU" is used as a unit for the writing operation in the second programming mode. For example, in the second area 302 of the MSM 310, the memory cells constituting the PPUs 3021 to 3022 only use the LSBs for storing data. Namely, when the MLC NAND flash memory module is employed to simulate the SLC NAND flash memory module, the MLC NAND flash memory module has only the "lower PPUs" available for writing (or storing) data. In this case, for descriptive convenience, only the two PPUs 3021 to 3022 in the second area 302 of the MSM 310 are illustrated in FIG. 7.

Being similar to the MSM 310 described above, the MSM 320 may include PPU sets 3031 to 3033. The PPU sets 3031 to 3033 belong to the first area 303 of the MSM 320. Additionally, the second area 304 of the MSM 320 may include PPUs 3041 to 3042.

Being similar to the MSM 310 described above, the MSM 330 may include PPU sets 3051 to 3053. The PPU sets 3051 to 3053 belong to the first area 305 of the MSM 330. Additionally, the second area 306 of the MSM 330 may include PPUs 3061 to 3062.

Being similar to the MSM 310 described above, the MSM 340 may include PPU sets 3071 to 3073. The PPU sets 3071 to 3073 belong to the first area 307 of the MSM 340. Additionally, the second area 308 of the MSM 340 may include PPUs 3081 to 3082.

It is to be mentioned that it is assumed here that the MCCU 404 receives a write command and data (also referred to as first data) corresponding the write command from the host system 11, and when the MCCU 404 is to write the first data into the RNVM module 406, the MCCU 404 first divides the first data into a plurality of sub-data (also referred to a plurality of first sub-data) according to a size of each "PPU set" and sequentially writes the first sub-data matching the size of each "PPU set" into the first areas 301 to 307 in the MSMs 310 to 340 in an interleave mode. Additionally, if there is any remaining sub-data other than the first sub-data and not matching the size of each "PPU set" in the first data, the remaining sub-data is written into one of the second areas 302 to 308 of the MSMs 310 to 340.

In detail, it is assumed that the MCCU 404 may divide the first data into sub-data DATA1 to sub-data DATA15, number these sub-data and record the numbers corresponding to these sub-data in a system area (not shown) of the RNVM module 406. The MCCU 404 may issue a command sequence to the RNVM module 406, such that a control circuit of the RNVM module 406 uses the first programming mode to write each of the sub-data DATA1 to the sub-data DATA2 into the lower PPU and the upper PPU of the PPU set 3011 of the MSM 310. Then, the MCCU 404 may issue a command sequence to the RNVM module 406, such that the control circuit of the RNVM module 406 uses the first programming mode to write each of the sub-data DATA3 to the sub-data DATA4 into the lower PPU and the upper PPU of the PPU set 3031 of the MSM 320.

Thereafter, the sub-data DATA5 to the sub-data DATA14 are respectively written into the lower PPUs and the upper PPUs of the PPU sets 3051, 3071, 3012 and 3032 of the MSMs 310 to 340 in the same way as that of writing each of the sub-data ATA1 to the sub-data DATA4, which will not be repeatedly described hereinafter.

Figure 8:
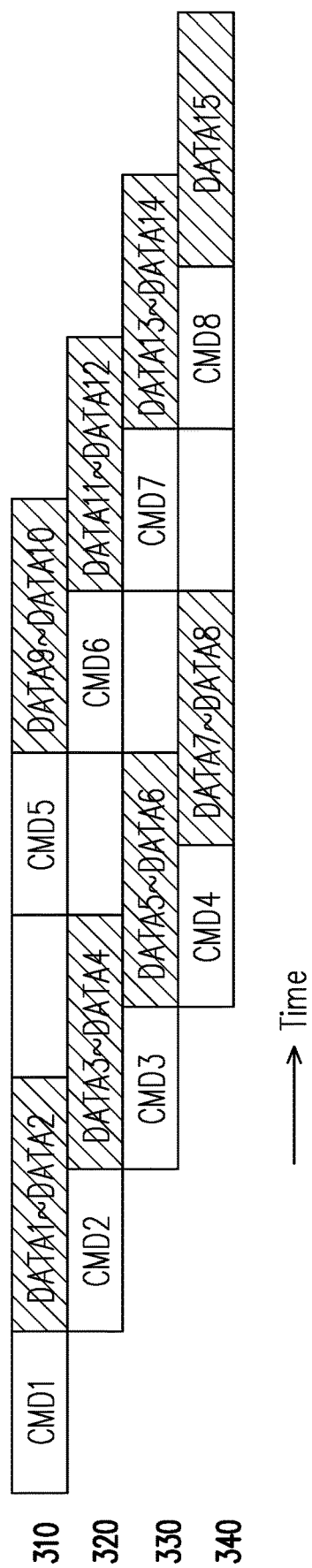
FIG. 8 is a schematic diagram illustrating writing sub-data into the memory sub-modules from a perspective of time according to an exemplary embodiment of the invention.

FIG. 8 is a schematic diagram illustrating writing sub-data into the MSMs from a perspective of time according to an exemplary embodiment of the invention. Particularly, the writing operation of the sub-data depicted in FIG. 7 is illustrated from the perspective of time in the exemplary embodiment in FIG. 8.

Referring to FIG. 7 and FIG. 8 simultaneously, when the RNVM module 406 receives a command sequence CMD1 sent by the MCCU 404, the control circuit of the RNVM module 406 writes the sub-data DATA1 to the sub-data DATA2 into the MSM 310 according to the command sequence CMD1. The RNVM module 406 may also receive another command sequence CMD2 sent by the MCCU 404 while writing the sub-data DATA1 to the sub-data DATA2 into the MSM 310. The control circuit of the RNVM module 406 writes the sub-data DATA3 to the sub-data DATA4 into the MSM 320 according to the command sequence CMD2. Namely, during the period of writing the sub-data DATA1 to the sub-data DATA2 into the MSM 310, the control circuit of the RNVM module 406 may write the sub-data DATA3 to the sub-data DATA4 into the MSM 320 in parallel (or simultaneously).

In the same way, the RNVM module 406 may also receive another command sequence CMD3 from the MCCU 404 during the period of writing the sub-data DATA3 to the sub-data DATA4 into the MSM 320. The control circuit of the RNVM module 406 writes the sub-data DATA5 to the sub-data DATA6 into the MSM 330 according to the command sequence CMD3. The RNVM module 406 may also receive another command sequence CMD4 from the MCCU 404 during the period of writing the sub-data DATA5 to the sub-data DATA6 into the MSM 330. The control circuit of the RNVM module 406 writes the sub-data DATA7 to the sub-data DATA8 into the MSM 340 according to the command sequence CMD4.

In particular, during the period of writing the sub-data DATA7 to the sub-data DATA8 into the MSM 340, as the writing operation corresponding to the sub-data DATA1 to the sub-data DATA2 is completed, the MSM 310 in this circumstance is in an idle state. Thus, the RNVM module 406 may receive another command sequence CMD5 from the MCCU 404. The control circuit of the RNVM module 406 writes the sub-data DATA9 to the sub-data DATA10 into the MSM 310 according to the command sequence CMD5. Similarly, during the period of writing the sub-data DATA9 to the sub-data DATA10 into the MSM 310, as the writing operation corresponding to the sub-data DATA3 to the sub-data DATA4 is completed, the MSM 320 in this circumstance is in the idle state. The RNVM module 406 may receive another command sequence CMD6 from the MCCU 404 to write the sub-data DATA11 to the sub-data DATA12 into the MSM 320. Similarly, during the period of writing the sub-data DATA11 to the sub-data DATA12 into the MSM 320, as the writing operation corresponding to the sub-data DATA5 to the sub-data DATA6 is completed, the MSM 330 in this circumstance is in the idle state. The RNVM module 406 may receive another command sequence CMD7 from the MCCU 404 to write the sub-data DATA13 to the sub-data DATA14 into the MSM 330.

It should be noted that "the sub-data DATA1 to the sub-data DATA2", "the sub-data DATA3 to the sub-data DATA4", "the sub-data DATA5 to the sub-data DATA6", "the sub-data DATA7 to the sub-data DATA8", "the sub-data DATA9 to the sub-data DATA10", "the sub-data DATA11 to the sub-data DATA12" and "the sub-data DATA13 to the sub-data DATA14" may be respectively referred to as "first sub-data", and a size of each of the first sub-data is the same as a preset size (i.e., the size of one PPU set).

Specially, referring again to FIG. 7, during the process in which the control circuit of the RNVM module 406 uses the first programming mode to write each of the sub-data DATA13 to the sub-data DATA14 into the lower PPU and the upper PPU of the PPU set 3052 of the MSM 330, the MCCU 404 may also issue a command sequence to the RNVM module 406, such that the control circuit of the RNVM module 406 uses a second programming mode to write the remaining sub-data DATA15 other than the first sub-data in the first data into the PPU 3081 of the second area 308 of the MSM 340. It is to be noted that the MSM 340 (also referred to a second MSM) employed for writing the remaining sub-data DATA15 is different from the MSM 330 (also referred to a third MSM) which is a last MSM for writing each of the first sub-data (i.e., the sub-data DATA13 to the sub-data DATA14). Particularly, in the present exemplary embodiment, the second MSM is the one located next to the third MSM. However, the invention is not limited thereto, in other embodiments, the second MSM may also be another MSM (for example, the MSM 310 or the MSM 320) which is different from the third MSM.

To be more detailed, referring again to FIG. 8, during the period of writing the sub-data DATA13 to the sub-data DATA14 into the MSM 330, as the writing operation corresponding to the sub-data DATA7 to the sub-data DATA8 is completed, the MSM 340 is in the idle state. The RNVM module 406 may receive another command sequence CMD8 from the MCCU 404 to use the second programming mode to write the sub-data DATA15 into the second area 308 of the MSM 340 located next to the MSM 330. Namely, in this way, the sub-data DATA15 may be written in parallel while the sub-data DATA13 to the sub-data DATA14 are written.

In other exemplary embodiments, after the RNVM module 406 receives the command sequence CMD8 sent by the MCCU 404, as the writing operation corresponding to the sub-data DATA9 to the sub-data DATA10 is completed at this time, the MSM 310 is also in the idle state. If the data is still written by using the interleave mode in which the first area and the second area are separately operated, the control circuit of the RNVM module 406 may also use the second programming mode to write the sub-data DATA15 into the second area 302 of the MSM 310. However, in this circumstance, the sub-data DATA15 is not written into the second area 302 of the MSM 310 until the writing operation of the MSM 340 by using the interleave mode is abandoned.

In other exemplary embodiments, if it is assumed that the MSM 320 is in the idle state after the RNVM module 406 receives the command sequence CMD8 sent by the MCCU 404, and the writing operation corresponding to the sub-data DATA11 to the sub-data DATA12 is completed, the control circuit of the RNVM module 406 may also use the second programming mode to write the sub-data DATA15 into the second area 304 of the MSM 320. However, in this circumstance, the sub-data DATA15 is not written into the second area 304 of the MSM 320 until the writing operation of the MSMs 340 and 310 by using the interleave mode is abandoned.

During the period of writing the sub-data DATA13 to the sub-data DATA14 into the MSM 330 by using the interleave mode in which the first area and the second area are separately operated, the sub-data DATA15 may be written into the MSM 310 only by sparing the time for the writing operation of the MSM 340 by using the interleave mode and waiting for the control circuit of the RNVM module 406 to issue a command for writing data into the MSM 310 in the interleave mode. Likewise, the sub-data DATA15 may be written into the MSM 320 only by sparing the time for the writing operation of the MSMs 340 and 310 and waiting for the control circuit of the RNVM module 406 to issue a command for writing data into the MSM 320 in the interleave mode. Namely, when the writing operation in the interleave mode is a mode in which the first area and the second area are separately operated, the programming time is incapable of being reduced to the maximum extent no matter whether the sub-data DATA15 is written into the second area 304 of the MSM 320 or the second area or 302 of the MSM 310.

Specially, after the RNVM module 406 receives the command sequence CMD8 sent by the MCCU 404, as the sub-data DATA13 to the sub-data DATA14 are not completely written into the MSM 330, it has to wait for the sub-data DATA13 to the sub-data DATA14 being completely written into the MSM 330 if the sub-data DATA15 is to be written into the second area 306 of the MSM 330, and after the writing operations of the MSMs 340, 310 and 320 by using the interleave mode are sequentially abandoned, the sub-data DATA15 is allowed to be written into the MSM 330. Namely, when the control circuit of the RNVM module 406 has to sequentially write the data into the first area 305 and the second area 306 of the MSM 330, the MCCU 404 is not allowed to issue the command sequence CMD8 for writing data into the second area 306 until the control circuit of the RNVM module 406 writes the sub-data DATA13 to the sub-data DATA14 into the first area 305, and such manner may result in the reduction of writing efficiency.

It is to be mentioned that in the present exemplary embodiment, the second area 302 of the MSM 310, the second area 304 of the MSM 320, the second area 306 of the MSM 330 and the second area 308 of the MSM 340 may be considered as areas for temporarily storing data. If the MCCU 404 then receives sub-data DATA16 (not shown), the MCCU 404 may copy the sub-data DATA15 to the lower PPU of the PPU set 3072 of the MSM 340 and write the sub-data DATA16 into the upper PPU of the PPU set 3072 of the MSM 340. In this circumstance, the sub-data DATA15 stored in the second area 308 becomes invalid data.

Additionally, if it is assumed that the RNVM module 406 is powered off and then re-powered on in the state illustrated in FIG. 7, the MCCU 404 has to determine whether valid data is stored in the second areas 302 to 308. To be specific, the MCCU 404 may search among data numbers (which are referred to as first data numbers in this case) corresponding to the data stored in the first areas 301 to 307 to obtain a maximum data number (which is referred to as a third data number in this case). The third data number is greater than the other data numbers among the first data numbers. In the present exemplary embodiment, it is assumed that the third data number is the data number corresponding to the sub-data DATA14. Additionally, the MCCU 404 also has to search among data numbers (which are referred to as second data numbers) of the sub-data stored in the second areas 302 to 308 to obtain a maximum data number (which is referred to as a fourth data number in this case). Herein, the fourth data number is greater than the other data numbers among the second data numbers.

When the fourth data number is greater than the third data number, the MCCU 404 may identify the data corresponding to a data number (which are also referred to as a fifth data number) in the second areas 302 to 308 which is greater than the third data number as valid data. For instance, in the present exemplary embodiment, as the third data number is the data number corresponding to the sub-data DATA14, the sub-data DATA15 is stored in the second area 308, and as the data number corresponding to the sub-data DATA15 is greater than the data number corresponding to the sub-data DATA14, the MCCU 404 may identify the sub-data (i.e., the sub-data DATA15) corresponding to the data number which is greater than the data number corresponding to the sub-data DATA14 in the second area 308 as valid data.

However, when the fourth data number obtained from the second areas 302 to 308 is less than the third data number obtained from the first areas 301 to 307, the MCCU 404 may identify the data stored in the second area 302, the second area 304, the second area 306 and the second area 308 as invalid data.

By the aforementioned method, while the RNVM module 406 programs the MSM 330, the MCCU 404 may issue a command sequence for writing the remaining sub-data into a MSM (for example, the MSM 340) which is different from the last MSM (for example, the MSM 330) for writing the first sub-data. In other words, the interleave mode for writing data into the second area and the interleave mode for writing data into the first area are associated with each other, instead of being separately operated. Thus, while the RNVM module 406 writes the sub-data DATA13 and the sub-data DATA14 into the MSM 330 according to the command sequence, the MCCU 404 may re-issue the command sequence to control the RNVM module 406 to simultaneously program the remaining sub-data DATA15 into the PPU belonging to a different MSM, which is preferably the one next to the MSM written by using the interleave mode, e.g., the MSM 340 in the present embodiment. In this way, not only the time for programming may be reduced, but also the efficiency of writing data may be improved.

Figure 9:
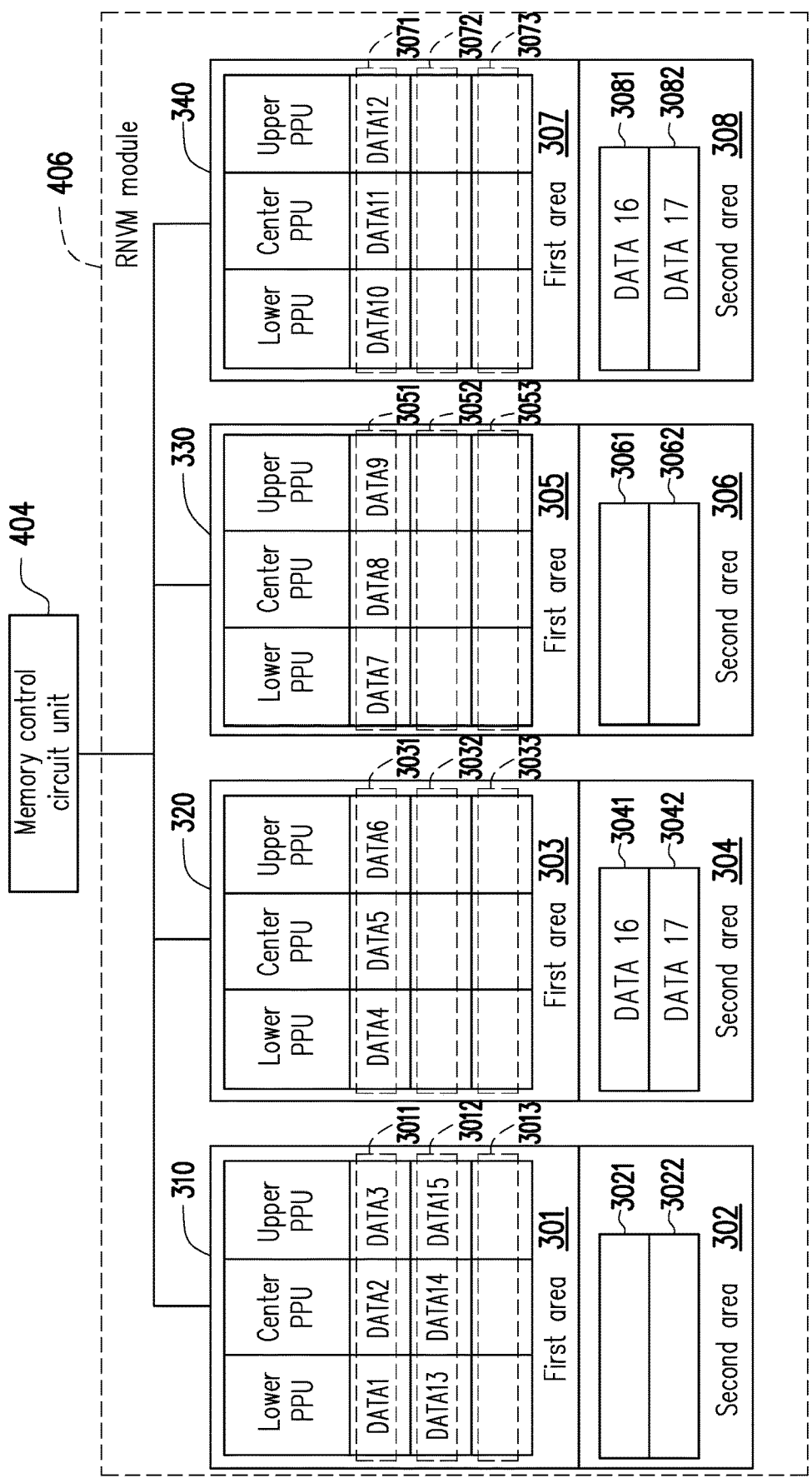
FIG. 9 is a schematic block diagram of an implementation example of the rewritable non-volatile memory module.

FIG. 9 is a schematic block diagram of an implementation example of the RNVM module.

In the present exemplary embodiment, the RNVM module 406 including the MSMs 310 to 340 arranged in an order is illustrated for example. The MSM 310 has the first area 301 and the second area 302, the MSM 320 has the first area 303 and the second area 304, the MSM 330 has the first area 305 and the second area 306, and the MSM 340 has the first area 307 and the second area 308. It is assumed that the RNVM module 406 is a TLC NAND flash memory module, each of the memory cells in the first area of each of the MSMs 310 to 340 is capable of storing 3 bits, the memory cells on the same word line constitute one or a plurality of PPUs, and the PPUs on the same word line may be at least classified into a lower PPU, a center PPU and an upper PPU. Specifically, the PPUs of the first areas 301 to 307 are written by using the first programming mode, and one "PPU set" is used as a unit for the writing operation in the first programming mode. The PPUs of the second areas 302 to 308 are written by using the second programming mode, and one "PPU" is used as a unit for the writing operation in the second programming mode.

In the present exemplary embodiment, a least significant bit (LSB) of each memory cell belonging to the same word line constitutes a lower PPU, a center significant bit (CSB) of each memory cell belonging to the same word line constitutes a center PPU, a most significant bit (MSB) of each memory cell belonging to the same word line constitutes an upper PPU, and the lower PPU, the center PPU and the upper PPU belonging to the same word line constitute a PPU set. For example, the lower PPU, the center PPU and the upper PPU constituted by the memory cells on one word line of the MSM 310 may constitute a PPU set 3011. The lower PPU, the center PPU and the upper PPU constituted by the memory cells on another word line of the MSM 310 may constitute a PPU set 3012. The lower PPU, the center PPU and the upper PPU constituted by the memory cells on another word line of the MSM 310 may constitute a PPU set 3013. Therein, the PPU sets 3011 to 3013 belong to the first area 301 of the MSM 310.

Additionally, the second area 302 of the MSM 310 may include the PPUs 3021 to 3022. The PPUs 3021 to 3022 may be written by using the second programming mode, and one "PPU" is used as a unit for the writing operation in the second programming mode. For example, in the second area 302 of the MSM 310, the memory cells constituting the PPUs 3021 to 3022 only use the LSBs for storing data. Namely, when the TLC NAND flash memory module is employed to simulate the SLC NAND flash memory module, the TLC NAND flash memory module has only the "lower PPUs" available for writing (or storing) data. In this case, for descriptive convenience, only the two PPUs 3021 to 3022 in the second area 302 of the MSM 310 are illustrated in FIG. 8.

Being similar to the MSM 310 described above, the MSM 320 may include the PPU sets 3031 to 3033. The PPU sets 3031 to 3033 belong to the first area 303 of the MSM 320. Additionally, the second area 304 of the MSM 320 may include the PPUs 3041 to 3042.

Being similar to the MSM 310 described above, the MSM 330 may include the PPU sets 3051 to 3053. The PPU sets 3051 to 3053 belong to the first area 305 of the MSM 330. Additionally, the second area 306 of the MSM 330 may include the PPUs 3061 to 3062.

Being similar to the MSM 310 described above, the MSM 340 may include the PPU sets 3071 to 3073. The PPU sets 3071 to 3073 belong to the first area 307 of the MSM 340. Additionally, the second area 308 of the MSM 340 may include the PPUs 3081 to 3082.

It is to be mentioned that it is assumed that the MCCU 404 receives a write command and data (also referred to as first data) corresponding the write command from the host system 11, and when the MCCU 404 is to write the first data into the RNVM module 406, the MCCU 404 first divides the first data into a plurality of sub-data (also referred to a plurality of first sub-data) according to a size of each "PPU set" and sequentially writes the first sub-data matching the size of each "PPU set" into the first areas in the MSMs 310 to 340 by using the interleave mode. Additionally, if there is any remaining sub-data other than the first sub-data not matching the size of each "PPU set" among the first data, the remaining sub-data is written into one of the second areas of the MSMs 310 to 340.

In detail, it is assumed that the MCCU 404 may divide the first data into sub-data DATA1 to sub-data DATA17, number these sub-data and record data numbers corresponding to these sub-data in the system area (not shown) of the RNVM module 406. The MCCU 404 may issue a command sequence to the RNVM module 406, such that the control circuit of the control circuit of the RNVM module 406 uses the first programming mode to write each of the sub-data DATA1 to the sub-data DATA3 into the lower PPU, the center PPU and the upper PPU of the PPU set 3011 of the MSM 310. The MCCU 404 may issue a command sequence to the RNVM module 406, such that the control circuit of the RNVM module 406 uses the first programming mode to write each of the sub-data DATA4 to the sub-data DATA6 into the lower PPU, the center PPU and the upper PPU of the PPU set 3031 of the MSM 320.

Each of the sub-data DATA7 to the sub-data DATA15 is written in the same manner as that of writing the sub-data DATA1 to the sub-data DATA6 and will not be repeatedly described hereinafter.

Figure 10:
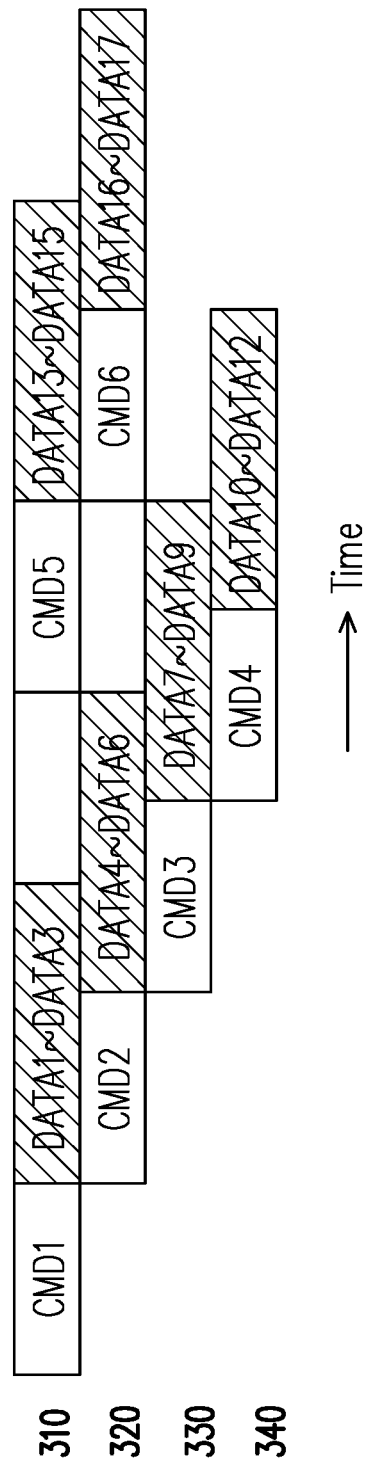
FIG. 10 is a schematic diagram illustrating the writing of the sub-data into the memory sub-modules from a perspective of time according to another exemplary embodiment of the invention.

FIG. 10 is a schematic diagram illustrating the writing of the sub-data into the MSMs from a perspective of time according to another exemplary embodiment of the invention. Particularly, the writing operation of the sub-data depicted in FIG. 9 is illustrated from the perspective of time in the exemplary embodiment in FIG. 10.

Referring to FIG. 9 and FIG. 10 simultaneously, when the RNVM module 406 receives the command sequence CMD1 sent by the MCCU 404, the control circuit of the RNVM module 406 writes the sub-data DATA1 to the sub-data DATA3 into the MSM 310 according to the command sequence CMD1. The RNVM module 406 may also receive another command sequence CMD2 sent by the MCCU 404 while writing the sub-data DATA1 to the sub-data DATA3 into the MSM 310. The control circuit of the RNVM module 406 writes the sub-data DATA4 to the sub-data DATA6 into the MSM 320 according to the command sequence CMD2. Namely, during the period of writing the sub-data DATA1 to the sub-data DATA3 into the MSM 310, the control circuit of the RNVM module 406 may write the sub-data DATA4 to the sub-data DATA6 into the MSM 320 in parallel (or simultaneously).

In the same way, the RNVM module 406 may also receive another command sequence CMD3 from the MCCU 404 during the period of writing the sub-data DATA4 to the sub-data DATA6 into the MSM 320. The control circuit of the RNVM module 406 writes the sub-data DATA7 to the sub-data DATA9 into the MSM 330 according to the command sequence CMD3. The RNVM module 406 may also receive another command sequence CMD4 from the MCCU 404 during the period of writing the sub-data DATA7 to the sub-data DATA9 into the MSM 330. The control circuit of the RNVM module 406 writes the sub-data DATA10 to the sub-data DATA12 into the MSM 340 according to the command sequence CMD4.

In particular, during the period of writing the sub-data DATA10 to the sub-data DATA12 into the MSM 340, as the writing operation corresponding to the sub-data DATA1 to the sub-data DATA3 is completed, the MSM 310 in this circumstance is in the idle state. Thus, the RNVM module 406 may receive another command sequence CMD5 from the MCCU 404. The control circuit of the RNVM module 406 writes the sub-data DATA13 to the sub-data DATA15 into the MSM 310 according to the command sequence CMD5.

It should be noted that in the exemplary embodiment illustrated in FIG. 9, "the sub-data DATA1 to the sub-data DATA3", "the sub-data DATA4 to the sub-data DATA6", "the sub-data DATA7 to the sub-data DATA9", "the sub-data DATA10 to the sub-data DATA12" and "the sub-data DATA13 to the sub-data DATA15" may be respectively referred as the "first sub-data", and the size of each of the first sub-data is the same as the preset size (i.e., the size of one PPU set).

Specially, referring again to FIG. 9, during the process in which the control circuit of the RNVM module 406 uses the first programming mode to write each of the sub-data DATA13 to the sub-data DATA15 into the lower PPU, the center PPU and the upper PPU of the PPU set 3012 of the MSM 310, the MCCU 404 may also issue a command sequence to the RNVM module 406, such that the control circuit of the RNVM module 406 uses the second programming mode to write each of the remaining sub-data DATA16 to the remaining sub-data DATA17 other than the first sub-data among the first data into the PPUs 3041 to 3042 of the second area 304 of the MSM 320. It is to be noted that the MSM 320 (also referred to the second MSM) for writing the remaining sub-data DATA16 to the remaining sub-data DATA17 is different from the MSM 310 (also referred to the third MSM) which is the last one for writing each of the first sub-data (i.e., the sub-data DATA13 to the sub-data DATA15). Particularly, in the present exemplary embodiment, the second MSM is the one located next to the third MSM. However, the invention is not limited thereto, in other embodiments, the second MSM may also be another MSM (for example, the MSM 330 or the MSM 340) which is different from the third MSM.

To be more detailed, referring again to FIG. 10, during the period of writing the sub-data DATA13 to the sub-data DATA15 into the MSM 310, as the writing operation corresponding to the sub-data DATA4 to the sub-data DATA6 is completed, the MSM 320 is in the idle state. The RNVM module 406 may receive another command sequence CMD6 from the MCCU 404 to use the second programming mode to write the sub-data DATA16 to the sub-data DATA17 into the second area 304 of the MSM 320 located next to the MSM 310. Namely, in this way, the sub-data DATA16 to the sub-data DATA17 may be written in parallel while the sub-data DATA13 to the sub-data DATA15 are written.

In other exemplary embodiments, after the RNVM module 406 receives the command sequence CMD6 sent by the MCCU 404, as the writing operation corresponding to the sub-data DATA7 to the sub-data DATA9 is completed at this time, the MSM 330 is also in the idle state. If the data is still written by using the interleave mode in which the first area and the second area are separately operated, the control circuit of the RNVM module 406 may also use the second programming mode to write the sub-data DATA16 to the sub-data DATA17 into the second area 306 of the MSM 330. However, in this circumstance, after the writing operation of the MSM 320 by using the interleave mode is abandoned, the sub-data DATA16 to the sub-data DATA 17 are written into the second area 306 of the MSM 330.

In other exemplary embodiments, after the RNVM module 406 receives the command sequence CMD6 sent by the MCCU 404, as the writing operation corresponding to the sub-data DATA10 to the sub-data DATA12 is completed at this time, the MSM 340 is also in the idle state, and the control circuit of the RNVM module 406 may also use the second programming mode to write the sub-data DATA16 to the sub-data DATA17 into the second area 308 of the MSM 340. However, in this circumstance, after the writing operation of the MSMs 320 and 330 by using the interleave mode is abandoned, the sub-data DATA16 to the sub-data DATA17 are written into the second area 308 of the MSM 340.

During the period of writing the sub-data DATA13 to the sub-data DATA15 into the MSM 310 by using the interleave mode in which the first area and the second area are separately operated, the sub-data DATA16 to the sub-data DATA17 may be written into the MSM 330 only by sparing the time for the writing operation of the MSM 320 and waiting for the control circuit of the RNVM module 406 to issue a command for writing data into the MSM 330 in the interleave mode. Likewise, the sub-data DATA16 to the sub-data DATA17 may be written into the MSM 340 only by sparing the time for the writing operation of the MSMs 320 and 330 and waiting for the control circuit of the RNVM module 406 to issue a command for writing data into the MSM 340 in the interleave-writing mode. Namely, when the writing operation in the interleave mode is a mode in which the first area and the second area are separately operated, the programming time is incapable of being reduced to the maximum extent no matter whether the sub-data DATA16 to the sub-data DATA17 is written into the second area 306 of the MSM 330 or the second area 308 of the MSM 340.

Specially, after the RNVM module 406 receives the command sequence CMD6 sent by the MCCU 404, as the sub-data DATA13 to the sub-data DATA15 are not completely written into the MSM 310 at this time, it has to wait for the sub-data DATA13 to the sub-data DATA15 being completely written into the MSM 310 if the sub-data DATA16 to the sub-data DATA17 are to be written into the second area 302 of the MSM 310, and after the writing operations of the MSMs 320, 330 and 340 by using the interleave mode are sequentially abandoned, the sub-data DATA16 to the sub-data DATA17 may be allowed to be written into the second area 302 of the MSM 310. Namely, when the control circuit of the RNVM module 406 has to sequentially perform the writing operation on the first area 301 and the second area 302 of the MSM 310, the MCCU 404 is not allowed to issue the command sequence CMD6 for writing data into the second area 302 until the control circuit of the RNVM module 406 writes the sub-data DATA13 to the sub-data DATA15 into the first area 301, which results in the reduction of writing efficiency.

It is to be mentioned that in the present exemplary embodiment, the second areas 302 to 308 may be considered as areas for temporarily storing data. If the MCCU 404 then receives sub-data DATA18 (not shown), the MCCU 404 may copy each of the sub-data DATA16 to the sub-data DATA17 to the lower PPU and the center PPU of the PPU set 3032 of the MSM 320 and writes the sub-data DATA18 into the upper PPU of the PPU set 3032 of the MSM 320. In this circumstance, the sub-data DATA16 to the sub-data DATA17 stored in the second area 304 become invalid data.

Additionally, if it is assumed that the RNVM module 406 is powered off and then re-powered on in the state illustrated in FIG. 9, the MCCU 404 has to determine whether valid data is stored in the second areas 302 to 308. To be specific, the MCCU 404 may search among data numbers (which are referred to as the first data numbers in this case) corresponding to the data stored in the first areas 301 to 307 to obtain a maximum data number (which is referred to as a third data number in this case). The third data number is greater than the other data numbers among the first data numbers. In the present exemplary embodiment, it is assumed that the third data number is the data number corresponding to the sub-data DATA15. Additionally, the MCCU 404 also has to search among data numbers (which are referred to as the second data numbers) of the sub-data stored in the second areas 302 to 308 to obtain a maximum data number (which is referred to as the fourth data number in this case). Herein, the fourth data number is greater than the other data numbers in the second data numbers.

When the fourth data number is greater than the third data number, the MCCU 404 may identify the data corresponding to a data number (which are also referred to as a fifth data number) in the second areas 302 to 308 which is greater than the third data number as valid data. For instance, in the present exemplary embodiment, as the third data number is the data number corresponding to the sub-data DATA15, the sub-data DATA17 is stored in the second area 308, and the data number corresponding to the sub-data DATA17 is greater than the data number corresponding to the sub-data DATA15, the MCCU 404 may identify each of the sub-data (i.e., the sub-data DATA16 to the sub-data DATA17) corresponding to the data numbers greater than the data number corresponding to the sub-data DATA15 in the second area 308 as valid data.

However, when the fourth data number obtained from the second areas 302 to 308 is less than the third data number obtained from the first areas 301 to 307, the MCCU 404 identifies the data stored in the second areas 302 to 308 as invalid data.

By the aforementioned method, while the RNVM module 406 programs the MSM 330, the MCCU 404 may issue a command sequence for writing the remaining sub-data into a MSM MSM (for example, the MSM 320) which is different from the last MSM (for example, the MSM 310) for writing the first sub-data. In other words, the interleave mode for writing data into the second area and the interleave mode for writing data into the first area are associated with each other, instead of being separately operated. Thus, while the RNVM module 406 writes the sub-data DATA13 to the sub-data DATA15, the MCCU 404 may re-issue the command sequence to control the RNVM module 406 to simultaneously program the remaining sub-data DATA16 to the remaining sub-data 17 into the PPUs belonging to a different MSM, which is preferably the one next to the MSM written by using the interleave mode, e.g., the MSM 320 in the present embodiment. In this way, not only the time for programming may be reduced, but also the efficiency of writing data may be improved.

Figure 11:
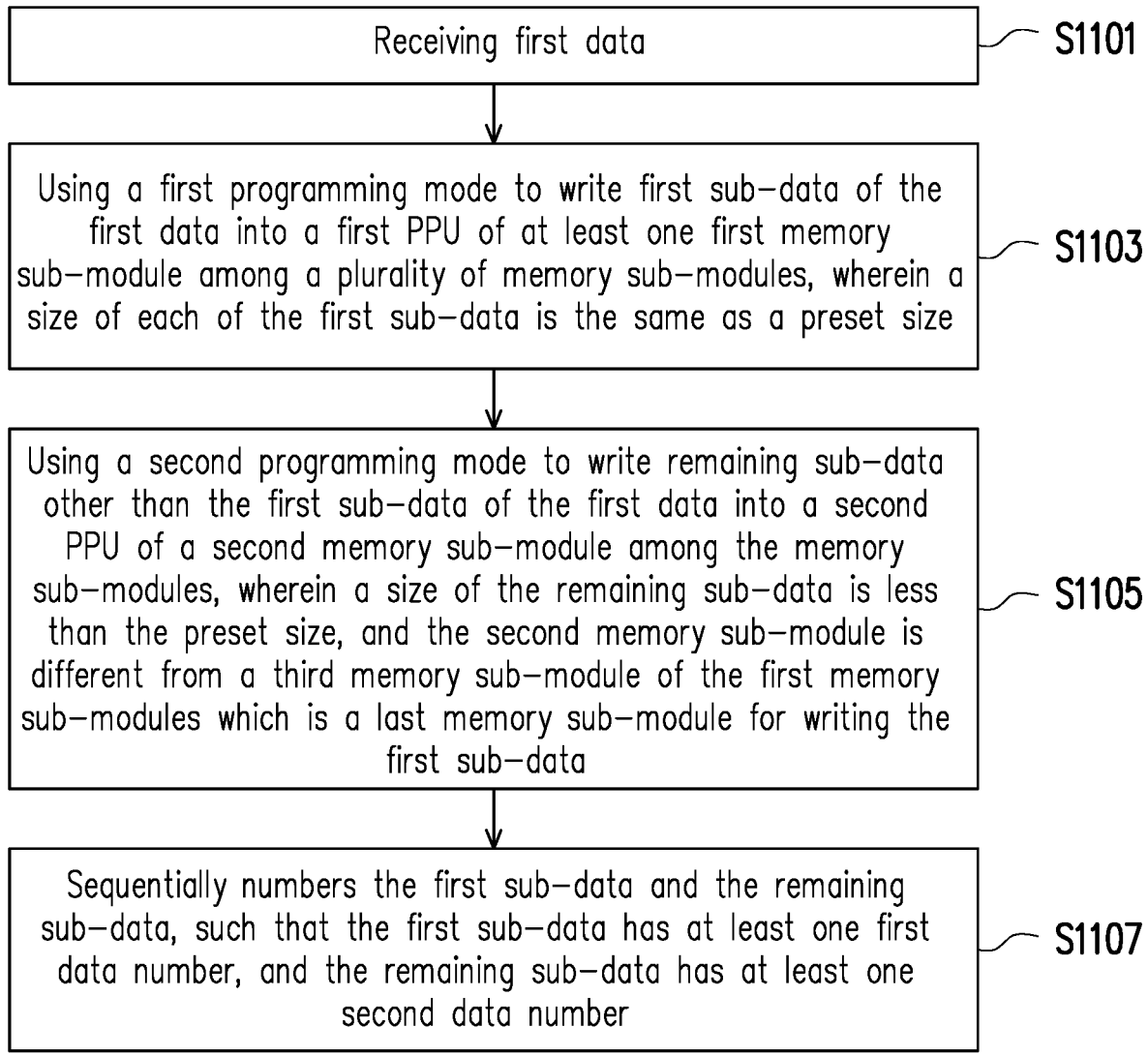
FIG. 11 is a flowchart illustrating a data writing method according to an exemplary embodiment of the invention.

FIG. 11 is a flowchart illustrating a data writing method according to an exemplary embodiment of the invention.

Referring to FIG. 11, in step S1101, the MCCU 404 receives first data which is to be stored in the RNVM module 406 from the host system 11. In step S1103, the MCCU 404 uses a first programming mode to write first sub-data of the first data into a first PPU of at least one first MSM among a plurality of MSMs. A size of each of the first sub-data is the same as a preset size. In step S1105, the MCCU 404 uses a second programming mode to write remaining sub-data other than the first sub-data of the first data into a second PPU of a second MSM among the MSMs. A size of the remaining sub-data is less than the preset size. Specially, the second MSM is different from a third MSM of the at least one first MSM which is a last MSM for writing the first sub-data. In an embodiment, the MSMs are arranged in an order, and the second MSM is located next to the third MSM in this order.

Additionally, the data writing method may further include the following steps. In step S1107, the MCCU 404 sequentially numbers the first sub-data and the remaining sub-data, such that the first sub-data has at least one first data number, and the remaining sub-data has at least one second data number.

Figure 12:
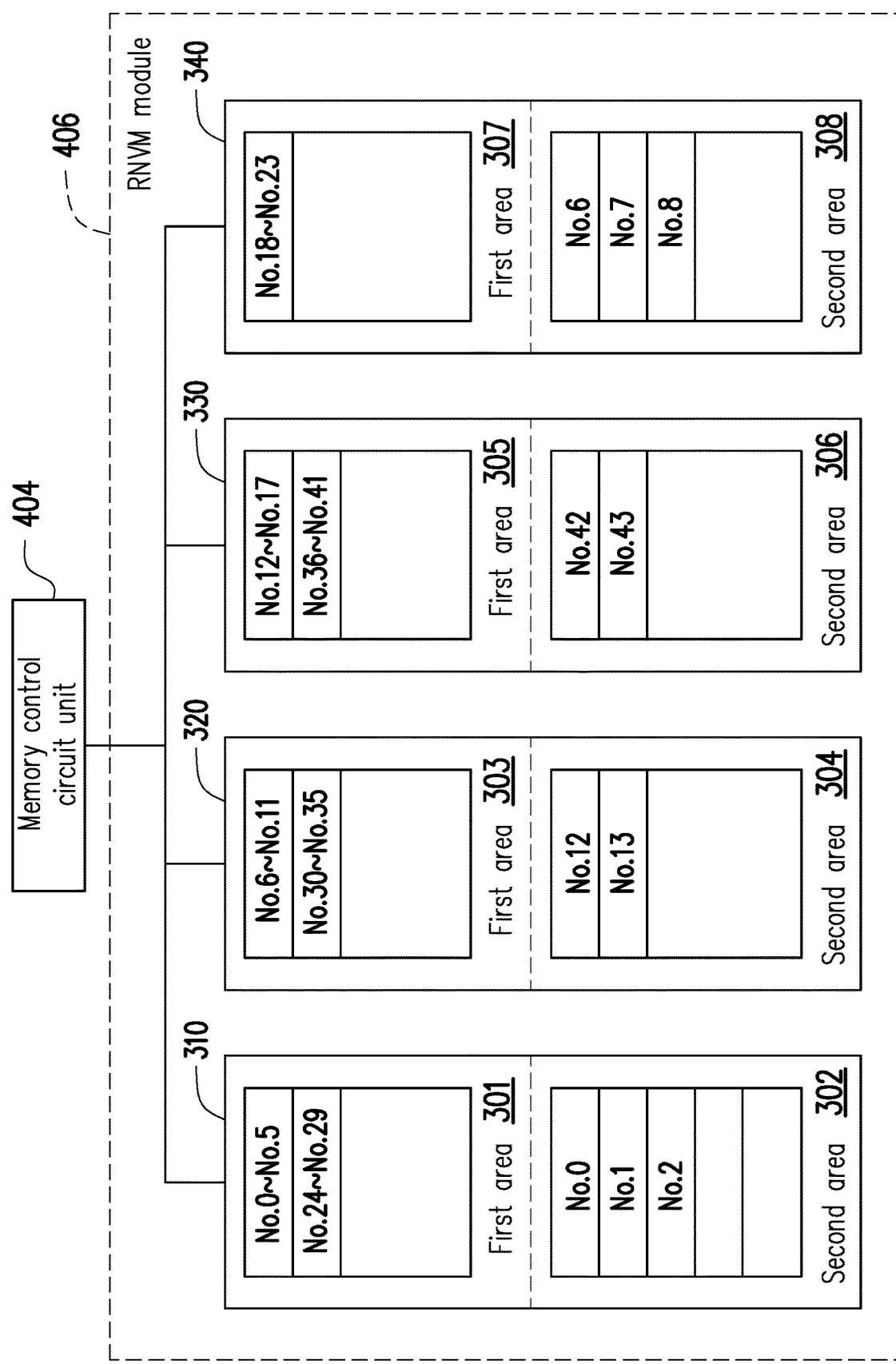
FIG. 12 is a schematic diagram illustrating data numbering in a valid data identifying method according to another exemplary embodiment of the invention.

FIG. 12 is a schematic diagram illustrating data numbering in a valid data identifying method according to another exemplary embodiment of the invention.

Referring to FIG. 12, steps of the valid data identifying method will be specifically described. In the present exemplary embodiment, the RNVM module 406 including the MSMs 310 to 340 arranged in an order is illustrated for example. The MSM 310 has the first area 301 and the second area 302, the MSM 320 has the first area 303 and the second area 304, the MSM 330 has the first area 305 and the second area 306, and the MSM 340 has the first area 307 and the second area 308. The first areas 301 to 307 are written by using the first programming mode, and the second areas 302 to 308 are written by using the second programming mode.

The first programming mode and the second programming mode have been described in detail above and thus, will not be repeated hereinafter.

Additionally, it is assumed that the first area 301 of the MSM 310 stores sub-data DATA0 to sub-data DATA5 and sub-data DATA24 to sub-data DATA29. Therein, data numbers corresponding to the sub-data DATA0 to the sub-data DATA5 are respectively No. 0 to No. 5, and data numbers corresponding to the sub-data DATA24 to the sub-data DATA29 are respectively No. 24 to No. 29. It is assumed that the first area 303 of the MSM 320 stores sub-data DATA6 to sub-data DATA11 and sub-data DATA30 to sub-data DATA35. Therein, data numbers corresponding to the sub-data DATA6 to the sub-data DATA11 are respectively No. 6 to No. 11, and data numbers corresponding to the sub-data DATA30 to the sub-data DATA35 are respectively No. 30 to No. 35. It is assumed that the first area 305 of the MSM 330 stores sub-data DATA12 to sub-data DATA17 and sub-data DATA36 to sub-data DATA41. Therein, data numbers corresponding to the sub-data DATA12 to the sub-data DATA17 are respectively No. 12 to No. 17, and data numbers corresponding to the sub-data DATA36 to the sub-data DATA41 are respectively No. 36 to No. 41. It is assumed that the first area 307 of the MSM 340 stores the sub-data DATA18 to the sub-data DATA23. Therein, data numbers corresponding to the sub-data DATA18 to the sub-data DATA23 are respectively No. 18 to No. 23.

Additionally, it is assumed that the second area 302 of the MSM 310 stores the sub-data DATA0 to the sub-data DATA2. Therein, data numbers corresponding to the sub-data DATA0 to the sub-data DATA2 are respectively No. 0 to No. 2. It is assumed that the second area 304 of the MSM 320 stores the sub-data DATA12 to the sub-data DATA13. Therein, data numbers corresponding to the sub-data DATA12 to the sub-data DATA13 are respectively No. 12 to No. 13. It is assumed that the second area 306 of the MSM 330 stores sub-data DATA42 to sub-data DATA43. Therein, data numbers corresponding to the sub-data DATA42 to the sub-data DATA43 are respectively No. 42 to No. 43. It is assumed that the second area 308 of the MSM 340 stores the sub-data DATA6 to the sub-data DATA8. Therein, data numbers corresponding to the sub-data DATA6 to the sub-data DATA8 are respectively No. 6 to No. 8.

When the RNVM module 406 is powered on, the MCCU 404 searches in the first areas 301 to 307 to obtain a maximum data number (which is referred to as a third data number in this case). The third data number is greater than the data numbers corresponding to the other sub-data in the first areas 301 to 307. In the exemplary embodiment illustrated in FIG. 12, the third data number is the data number No. 41 corresponding to the sub-data DATA41.

Additionally, the MCCU 404 further searches in the second areas 302 to 308 to obtain a maximum data number (which is referred to as a fourth data number in this case). The fourth data number is greater than the data numbers corresponding to the other sub-data in the second areas 302 to 308. In the exemplary embodiment illustrated in FIG. 12, the fourth data number is the data number No. 43 corresponding to the sub-data DATA43.

Thereafter, the MCCU 404 determines whether valid data is stored in the second areas 302 to 308 according to the obtained third data number and the obtained fourth data number.

To be specific, when the fourth data number is greater than the third data number, the MCCU 404 identifies the data corresponding to a data number (which is also referred to as a fifth data number in this case) which is greater than the third data number in the second areas 302 to 308 as valid data. For instance, in the present exemplary embodiment, as the third data number is the data number No. 41 corresponding to the sub-data DATA41, and the second area 306 stores the sub-data DATA43 whose data number No. 43 is greater than the data number No. 41 corresponding to the sub-data DATA41, the MCCU 404 may identify the data numbers No. 42 to No. 43 corresponding to the sub-data DATA42 to 43 in the second areas 302 to 308 as valid data.

However, when the fourth data number obtained from the second areas 302 to 308 is less than the third data number obtained from the first areas 301 to 307, the MCCU 404 determines the data stored in the second areas 302 to 308 as invalid data.

Figure 13:
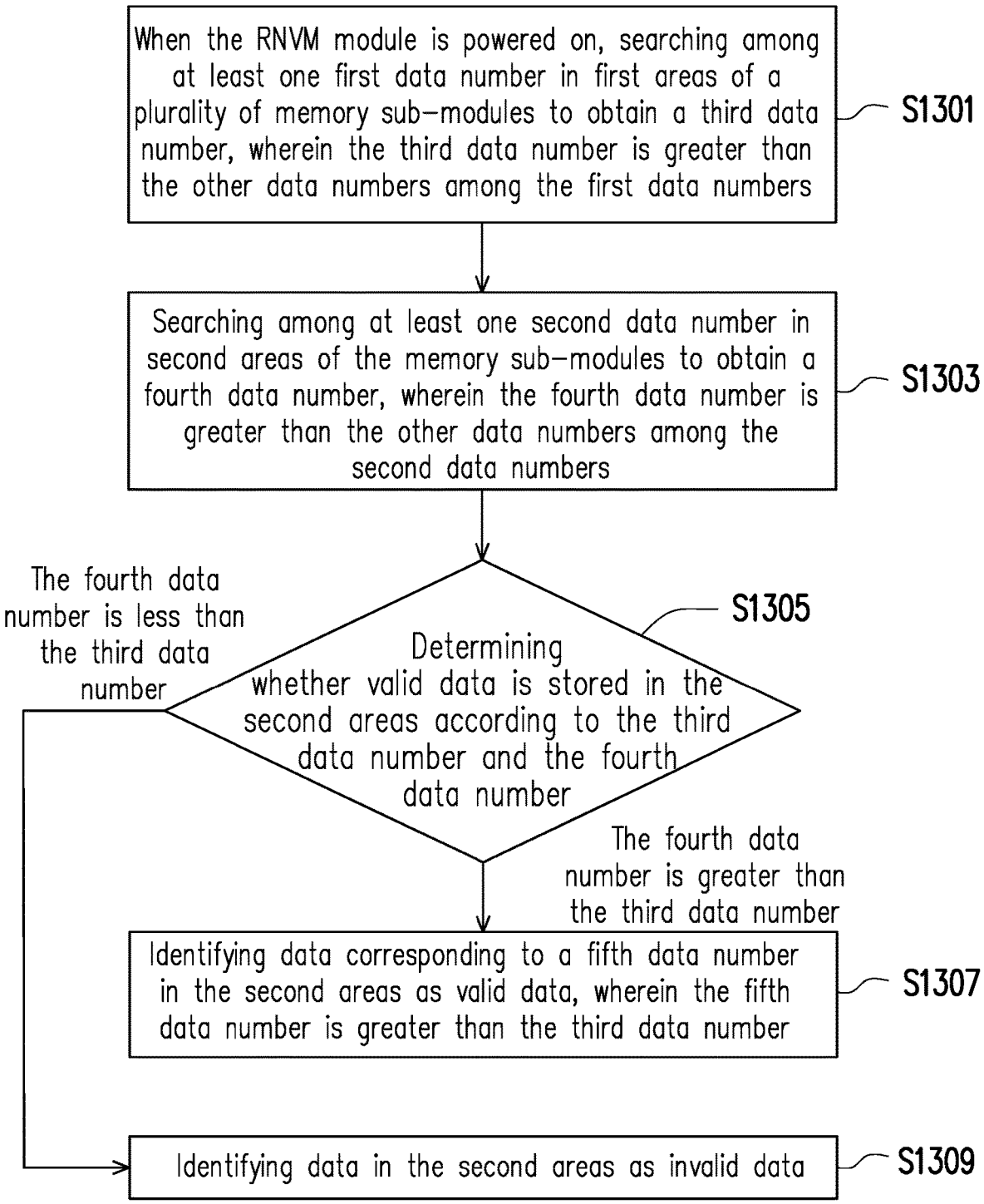
FIG. 13 is a flowchart illustrating a valid data identifying method according to another exemplary embodiment of the invention.

FIG. 13 is a flowchart illustrating a valid data identifying method according to another exemplary embodiment of the invention.

Referring to FIG. 13, in step S1301, when the RNVM module 406 is powered on, the MCCU 404 searches among at least one first data number in first areas of a plurality of MSMs to obtain a third data number, wherein the third data number is greater than the other data numbers among the first data numbers. In step S1303, the MCCU 404 searches among at least one second data number in second areas of the MSMs to obtain a fourth data number, wherein the fourth data number is greater than the other data numbers among the second data numbers. In step S1305, the MCCU 404 determines whether valid data is stored in any one of the second areas according to the third data number and the fourth data number. When the fourth data number is greater than the third data number, in step S1307, the MCCU 404 identifies data in the second area corresponding to a fifth data number which is greater than the third data number as valid data. When the fourth data number is less than the third data number, in step S1309, the MCCU 404 identifies the data in the second areas as invalid data.

In light of the foregoing, the data writing method, the valid data identifying method and the memory storage apparatus of the invention can achieve reducing the time for writing (or programming) data and improving the efficiency of writing data. Moreover, the valid data identifying method of the invention can achieve effectively identifying the valid data stored in the RNVM module after the memory storage apparatus is re-powered on. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module comprising a plurality of memory sub-modules coupled to a memory control circuit unit, each of the memory sub-modules comprising a plurality of physical programming units, and the data writing method comprising:

receiving first data;

using a first programming mode to write first sub-data of the first data into a first physical programming unit of at least one first memory sub-module among the memory sub-modules, wherein a size of each of the first sub-data is the same as a preset size; and using a second programming mode to write remaining sub-data other than the first sub-data of the first data into a second physical programming unit of a second memory sub-module among the memory sub-modules, wherein a size of the remaining sub-data is less than the preset size, wherein the number of bits stored by each of the physical programming units programmed by using the first programming mode is greater than the number of bits stored by each of the physical programming units programmed by using the second programming mode, wherein the second memory sub-module is different from a third memory sub-module of the at least one first memory sub-module which is a last memory sub-module for writing the first sub-data.

2. The data writing method according to claim 1, wherein write sequences of the memory sub-modules are arranged in an order, and the second memory sub-module is located next to the third memory sub-module in the order.

3. The data writing method according to claim 2, wherein the step of using the first programming mode to write the first sub-data of the first data into the first physical programming unit of the at least one first memory sub-module among the memory sub-modules comprises:

writing each of the first sub-data into the at least one first memory sub-module among the memory sub-modules according to the order.

4. The data writing method according to claim 1, wherein the first physical programming unit is constituted by a plurality of first memory cells and is in the first programming mode, and each of the first memory cells constituting the first physical programming unit stores multiple bits of data, and the second physical programming unit is constituted by a plurality of second memory cells and is in the second programming mode, and each of the second memory cells constituting the second physical programming unit only stores 1 bit of data.

5. The data writing method according to claim 1, further comprising:

sequentially numbering the first sub-data and the remaining sub-data, such that the first sub-data has at least one first data number, and the remaining sub-data has at least one second data number.

6. The data writing method according to claim 5, further comprising:

searching a third data number among the at least one first data number, wherein the third data number is greater than the other data numbers among the at least one first data number;

searching a fourth data number among the at least one second data number, wherein the fourth data number is greater than the other data numbers among the at least one second data number;

when the fourth data number is greater than the third data number, identifying data corresponding to a fifth data number among the at least one second data number as valid data, wherein the fifth data number is greater than the third data number; and when the fourth data number is less than the third data number, identifying data corresponding to the at least one second data number as invalid data.

7. A memory storage apparatus, comprising:

a connection interface unit, configured to be coupled to a host system;

a rewritable non-volatile memory module, comprising a plurality of memory sub-modules, and each of the memory sub-modules comprising a plurality of physical programming units; and a memory control circuit unit, coupled to the connection interface unit and the memory sub-modules of the rewritable non-volatile memory module, wherein the memory control circuit unit is configured to receive first data, wherein the memory control circuit unit is further configured to use a first programming mode to write first sub-data of the first data into a first physical programming unit of at least one first memory sub-module among the memory sub-modules, wherein a size of each of the first sub-data is the same as a preset size, wherein the memory control circuit unit is further configured to use a second programming mode to write remaining sub-data other than the first sub-data of the first data into a second physical programming unit of a second memory sub-module among the memory sub-modules, wherein a size of the remaining sub-data is less than the preset size, wherein the number of bits stored by each of the physical programming units programmed by using the first programming mode is greater than the number of bits stored by each of the physical programming units programmed by using the second programming mode, wherein the second memory sub-module is different from a third memory sub-module of the at least one first memory sub-module which is a last memory sub-module for writing the first sub-data.

8. The memory storage apparatus according to claim 7, wherein write sequences of the memory sub-modules are arranged in an order, the second memory sub-module is located next to the third memory sub-module in the order.

9. The memory storage apparatus according to claim 8, wherein in the operation of using the first programming mode to write the first sub-data of the first data into the first physical programming unit of the at least one first memory sub-module among the memory sub-modules, the memory control circuit unit writes each of the first sub-data into the at least one first memory sub-module among the memory sub-modules according to the order.

10. The memory storage apparatus according to claim 7, wherein the first physical programming unit is constituted by a plurality of first memory cells and is in the first programming mode, and each of the first memory cells constituting the first physical programming unit stores multiple bits of data, and the second physical programming unit is constituted by a plurality of second memory cells and is in the second programming mode, and each of the second memory cells constituting the second physical programming unit only stores 1 bit of data.

11. The memory storage apparatus according to claim 7, wherein the memory control circuit unit sequentially numbers the first sub-data and the remaining sub-data, such that the first sub-data has at least one first data number, and the remaining sub-data has at least one second data number.

12. The memory storage apparatus according to claim 11, wherein the memory control circuit unit searches a third data number among the at least one first data number, wherein the third data number is greater than the other data numbers among the at least one first data number, the memory control circuit unit searches a fourth data number among the at least one second data number, wherein the fourth data number is greater than the other data numbers among the at least one second data number, when the fourth data number is greater than the third data number, the memory control circuit unit identifies data corresponding to a fifth data number among the at least one second data number as valid data, wherein the fifth data number is greater than the third data number, and when the fourth data number is less than the third data number, the memory control circuit unit identifies data corresponding to the at least one second data number as invalid data.

13. A valid data identifying method for a rewritable non-volatile memory module comprising a plurality of memory sub-modules coupled to a memory control circuit unit, each of the memory sub-modules comprising a first area and a second area, each of the first areas and each of the second areas respectively comprising a plurality of physical programming units, and the valid data identifying method comprising:

when the rewritable non-volatile memory module is powered on, searching among at least one first data number in the first areas of the memory sub-modules to obtain a third data number, wherein the third data number is greater than the other data numbers among the at least one first data number;

searching among at least one second data number in the second areas of the memory sub-modules to obtain a fourth data number, wherein the fourth data number is greater than the other data numbers among the at least one second data number; and determining whether valid data is stored in the second areas according to the third data number and the fourth data number.

14. The valid data identifying method according to claim 13, further comprising:

receiving first data;

using a first programming mode to write first sub-data of the first data into a first physical programming unit of at least one first memory sub-module among the memory sub-modules, and sequentially numbering the first sub-data, such that the first sub-data has the at least one first data number, wherein the first physical programming unit belongs to one of the first areas, and a size of each of the first sub-data is the same as a preset size; and using a second programming mode to write remaining sub-data other than the first sub-data of the first data into a second physical programming unit of a second memory sub-module among the memory sub-modules, and sequentially numbering the remaining sub-data other than the first sub-data, such that the remaining sub-data has the at least one second data number, wherein the second physical programming unit belongs to one of the second areas, and a size of the remaining sub-data is less than the preset size, wherein the number of bits stored by each of the physical programming units programmed by using the first programming mode is greater than the number of bits stored by each of the physical programming units programmed by using the second programming mode, wherein the second memory sub-module is different from a third memory sub-module of the at least one first memory sub-module which is a last memory sub-module for writing the first sub-data.

15. The valid data identifying method according to claim 13, wherein the step of determining whether the valid data is stored in the second areas according to the third data number and the fourth data number comprising:
when the fourth data number is greater than the third data number, identifying data corresponding to a fifth data number in the second areas as valid data, wherein the fifth data number is greater than the third data number; and
when the fourth data number is less than the third data number, identifying data in the second areas as invalid data.

16. The valid data identifying method according to claim 15, wherein
the physical programming units of each first area is constituted by a plurality of first memory cells and is in the first programming mode, and each of the first memory cells constituting the physical programming units of each first area stores multiple bits of data, and
the physical programming units of each second area is constituted by a plurality of second memory cells and is in the second programming mode, and each of the second memory cells constituting the physical programming units of each second area only stores 1 bit of data.

17. A memory storage apparatus, comprising:
a connection interface unit, configured to be coupled to a host system;
a rewritable non-volatile memory module, comprising a plurality of memory sub-modules, each of the memory sub-modules comprising a first area and a second area, and each of the first areas and each of the second areas respectively comprising a plurality of physical programming units; and
a memory control circuit unit, coupled to the connection interface unit and the memory sub-modules of the rewritable non-volatile memory module,
wherein when the rewritable non-volatile memory module is powered on, the memory control circuit unit is configured to search among at least one first data number in the first areas of the memory sub-modules to obtain a third data number, wherein the third data number is greater than the other data numbers among the at least one first data number,
wherein the memory control circuit unit is further configured to search among at least one second data number in the second areas of the memory sub-modules to obtain a fourth data number, wherein the fourth data number is greater than the other data numbers among the at least one second data number,
wherein the memory control circuit unit is further configured to determine whether valid data is stored in the second areas according to the third data number and the fourth data number.

18. The memory storage apparatus according to claim 17, wherein
the memory control circuit unit receives first data,
the memory control circuit unit uses a first programming mode to write first sub-data of the first data into a first physical programming unit of at least one first memory sub-module among the memory sub-modules and sequentially numbers the first sub-data, such that the first sub-data has the at least one first data number, wherein the first physical programming unit belongs to one of the first areas, and a size of each of the first sub-data is the same as a preset size, and
the memory control circuit unit uses a second programming mode to write remaining sub-data other than the first sub-data of the first data into a second physical programming unit of a second memory sub-module among the memory sub-modules and sequentially numbers the remaining sub-data other than the first sub-data, such that the remaining sub-data has the at least one second data number, wherein the second physical programming unit belongs to one of the second areas, and a size of the remaining sub-data is less than the preset size,
wherein the number of bits stored by each of the physical programming units programmed by using the first programming mode is greater than the number of bits stored by each of the physical programming units programmed by using the second programming mode,
wherein the second memory sub-module is different from a third memory sub-module of the at least one first memory sub-module which is a last memory sub-module for writing the first sub-data.

19. The memory storage apparatus according to claim 17, wherein in the operation of determining whether the valid data is stored in the second areas according to the third data number and the fourth data number,
when the fourth data number is greater than the third data number, the memory control circuit unit identifies data corresponding to a fifth data number in the second areas as valid data, wherein the fifth data number is greater than the third data number, and
when the fourth data number is less than the third data number, the memory control circuit unit identifies data in the second areas as invalid data.

20. The memory storage apparatus according to claim 17, wherein
the physical programming units of each first area is constituted by a plurality of first memory cells and is in the first programming mode, and each of the first memory cells constituting the physical programming units of each first area stores multiple bits of data, and
the physical programming units of each second area is constituted by a plurality of second memory cells and is in the second programming mode, and each of the second memory cells constituting the physical programming units of each second area only stores 1 bit of data.

* * * * *